United States Patent
Matsuo

(10) Patent No.: US 11,640,819 B2
(45) Date of Patent: May 2, 2023

(54) INFORMATION PROCESSING APPARATUS AND UPDATE METHOD

(71) Applicant: FUJITSU LIMITED, Kawasaki (JP)

(72) Inventor: Naoshi Matsuo, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 130 days.

(21) Appl. No.: 17/085,630

(22) Filed: Oct. 30, 2020

(65) Prior Publication Data

US 2021/0193120 A1   Jun. 24, 2021

(30) Foreign Application Priority Data

Dec. 24, 2019   (JP) .............................. JP2019-233503

(51) Int. Cl.

| | | |
|---|---|---|
| *G10L 15/02* | (2006.01) | |
| *G10L 15/16* | (2006.01) | |
| *G10L 15/22* | (2006.01) | |
| *G10L 19/038* | (2013.01) | |
| *H04M 3/51* | (2006.01) | |
| *G10L 15/06* | (2013.01) | |
| *G06F 16/23* | (2019.01) | |
| *G06F 16/22* | (2019.01) | |

(52) U.S. Cl.
CPC ........ *G10L 15/063* (2013.01); *G06F 16/2282* (2019.01); *G06F 16/2379* (2019.01); *G10L 15/02* (2013.01); *G10L 15/16* (2013.01); *G10L 15/22* (2013.01); *G10L 19/038* (2013.01); *H04M 3/51* (2013.01); *G10L 2015/0635* (2013.01)

(58) Field of Classification Search
CPC ....... G10L 15/16; G10L 15/22; G10L 19/038; G10L 15/02; G06F 16/23; G06F 16/22
See application file for complete search history.

(56) References Cited

U.S. PATENT DOCUMENTS

| | | | |
|---|---|---|---|
| 8,185,390 B2* | 5/2012 | Printz | G10L 15/00 704/236 |
| 10,943,274 B2* | 3/2021 | Hoffberg | G06Q 10/10 |
| 2016/0086622 A1 | 3/2016 | Yamamoto | |
| 2016/0111112 A1* | 4/2016 | Hayakawa | G10L 15/51 |
| 2016/0300566 A1* | 10/2016 | Hofer | G10L 15/08 |
| 2019/0318726 A1* | 10/2019 | Jin | G10L 15/16 |
| 2020/0234126 A1* | 7/2020 | Covell | G06N 3/08 |
| 2020/0349925 A1* | 11/2020 | Shahid | G10L 15/08 |
| 2020/0349927 A1* | 11/2020 | Stoimenov | G10L 15/16 |

FOREIGN PATENT DOCUMENTS

| | | |
|---|---|---|
| JP | 2007-219286 | 8/2007 |
| JP | 2015-99304 | 5/2015 |
| JP | 2018-25827 | 2/2018 |

* cited by examiner

*Primary Examiner* — Richemond Dorvil
*Assistant Examiner* — Ethan Daniel Kim
(74) *Attorney, Agent, or Firm* — Staas & Halsey LLP

(57) ABSTRACT

A non-transitory computer-readable recording medium having stored therein an update program that causes a computer to execute a procedure, the procedure includes calculating a selection rate of each of a plurality of quantization points included in a quantization table, based on quantization data obtained by quantizing features of a plurality of utterance data, and updating the quantization table by updating the plurality of quantization points based on the selection rate.

12 Claims, 25 Drawing Sheets

FIG. 10

| | NUMBER | QUANTIZATION POINT | NUMBER OF SELECTIONS | FEATURE AMOUNT OF VOICE |
|---|---|---|---|---|
| UPDATE ← | 1 | $v_1(x,y)$ | 15 | ... |
| UPDATE ← | 2 | $v_2(x,y)$ | 21 | $(x',y'), (x'',y'')\cdots$ |
| REJECT | 3 | $v_3(x,y)$ | 0 | - |
| | ... | ... | ... | ... |
| EQUIVALENT TO SILENCE ← | n | $v_n(x,y)$ | 100 | ... |
| | ... | ... | ... | ... |
| REJECT | 256 | $v_{256}(x,y)$ | 4 | ... |

→ REPLACE WITH $V_2(X, Y)$

→ ONLY UPDATE, OTHER THAN REPLACEMENT TARGET $$v_2'(x,y) = \frac{(x',y') + (x'',y'') + \cdots}{21}$$

BEFORE UPDATE

| NUMBER | QUANTIZATION POINT | NUMBER OF SELECTIONS |
|---|---|---|
| 1 | $v_1(x,y)$ | 15 |
| 2 | $v_2(x,y)$ | 21 |
| 3 | $v_3(x,y)$ | 0 |
| ... | ... | ... |
| n | $v_n(x,y)$ | 100 |
| ... | ... | ... |
| 256 | $v_{256}(x,y)$ | 4 |

AFTER UPDATE

| NUMBER | QUANTIZATION POINT | NUMBER OF SELECTIONS |
|---|---|---|
| 1 | $v_1(x,y) \rightarrow v_1'(x,y)$ | 0 |
| 2 | $v_2(x,y) \rightarrow v_2'(x,y)$ | 0 |
| 3 | $v_3(x,y) \rightarrow v_1(x,y)$ | 0 |
| ... | ... | ... |
| n | $v_n'(x,y)$ | 0 |
| ... | ... | ... |
| 256 | $v_{256}(x,y) \rightarrow v_2(x,y)$ | 0 |

INFORMATION PROCESSING APPARATUS AND UPDATE METHOD

CROSS-REFERENCE TO RELATED APPLICATION

This application is based upon and claims the benefit of the prior Japanese Patent Application No. 2019-233503, filed on Dec. 24, 2019, the entire contents of which are incorporated herein by reference.

FIELD

The embodiments discussed herein are related to an information processing apparatus and an update method.

BACKGROUND

In recent years, call centers have recorded conversations between operators and customers and have accumulated information on the recorded conversations. There is a need for call centers to utilize the accumulated conversation information to improve their services.

For example, following techniques utilize the accumulated conversation information. As an example, there is a technique that determines the number of predetermined keywords included in the conversation between the customer and the operator, and displays an FAQ (Frequently Asked Question) or notifies a supervisor according to the determined number of keywords. In addition, there is a technique that determines whether the operator appropriately conveys the transmission content to the customer by converting the operator's voice into a character string and checking whether the transmission target keyword is included in the character string.

Related techniques are disclosed in, for example, Japanese Laid-Open Patent Publication No. 2015-099304.

SUMMARY

According to an aspect of the embodiments, a non-transitory computer-readable recording medium having stored therein an update program that causes a computer to execute a procedure, the procedure includes calculating a selection rate of each of a plurality of quantization points included in a quantization table, based on quantization data obtained by quantizing features of a plurality of utterance data, and updating the quantization table by updating the plurality of quantization points based on the selection rate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 10 is a diagram for explaining updating of the quantization table;

DESCRIPTION OF EMBODIMENTS

In a call center, there is a demand to detect whether there is a specific conversation situation designated in advance in a conversation between an operator and a customer. Here, when detecting whether there is a specific conversation situation using the existing technique, it is conceivable to perform a keyword setting comprehensively according to a conversation situation to be detected and perform a process of determining whether the set keyword is included in the conversation information.

However, it may be difficult to know in advance how many keywords need to be covered in order to detect a specific conversation situation. In addition, it may be difficult to set keywords comprehensively according to a person because there are various expressions in conversation having the same meaning.

Embodiments of a technique capable of detecting a specific conversation situation without performing a keyword setting for detecting the specific conversation situation will be described in detail with reference to the accompanying drawings. The present disclosure is not limited to these embodiments. Further, the embodiments may be combined appropriately unless contradictory.

First Embodiment

Figure 1:
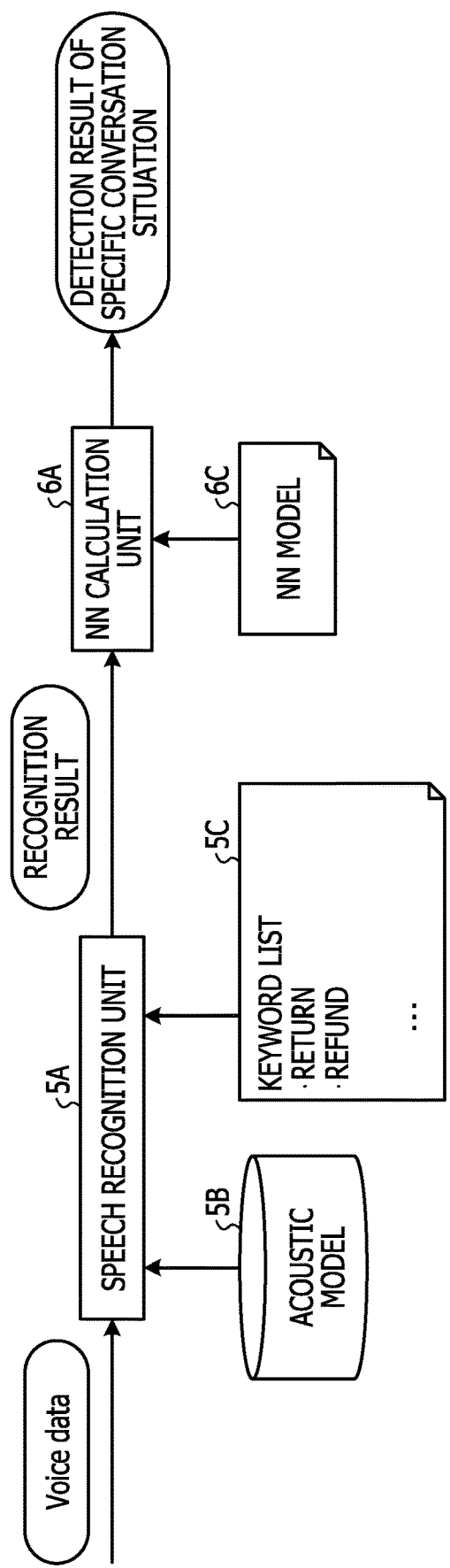
FIG. 1 is a diagram for explaining an example of a reference technique.

A reference technique will be described prior to description on a process of a learning device according to a first embodiment. This reference technique does not belong to the related art. FIG. 1 is a diagram for explaining an example of the reference technique. As illustrated in FIG. 1, the reference technique includes a speech recognition unit 5A and an NN (Neural Network) calculation unit 6A.

When voice data is input to the speech recognition unit 5A, the speech recognition unit 5A extracts a character string included in the voice data based on an acoustic model 5B, and recognizes whether the extracted character string corresponds to a keyword defined in a keyword list 5C. The speech recognition unit 5A outputs a result of the recognition to the NN calculation unit 6A.

The NN calculation unit 6A inputs a result of the recognition of the speech recognition unit 5A to an NN (not illustrated) based on a learned NN model 6C, and calculates an output value indicating whether the voice data includes a specific conversation situation. Here, in order to appropriately detect the specific conversation situation, keywords related to the specific conversation situation are comprehensively set in the keyword list 5C, and the NN model 6C is learned using the keyword list 5C. However, it is difficult to know in advance how many keywords need to be covered in order to detect the specific conversation situation. In addition, even when introducing to a different call center, it is desirable to adjust the keyword list 5C to be unique to the call center each time. In order to detect the specific conversation situation with high accuracy, this keyword setting and adjustment require a very large number of man-hours.

[Overall Configuration]

Figure 2:
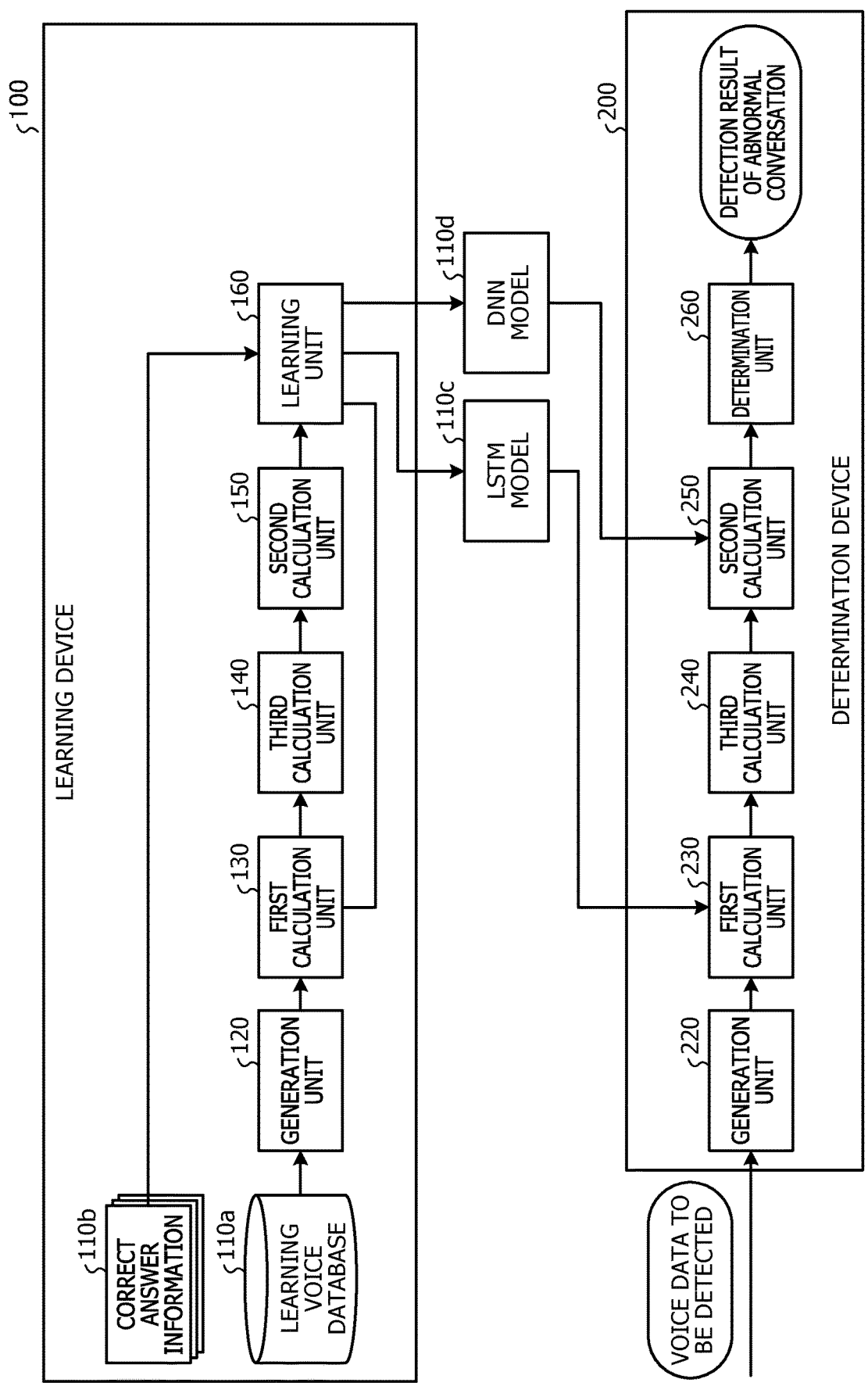
FIG. 2 is a diagram for explaining an example of a process of a learning device and a determination device according to a first embodiment.

Subsequently, an example of a process of a learning device and a determination device according to the first embodiment will be described. FIG. 2 is a diagram for explaining an example of a process of the learning device and the determination device according to the first embodiment. As illustrated in FIG. 2, the learning device 100 includes a learning voice database 110a, a generation unit 120, a first calculation unit 130, a third calculation unit 140, a second calculation unit 150, and a learning unit 160.

The learning voice database 110a stores a plurality of learning voice data generated by dividing each conversation data, and each learning voice data is associated with correct answer information 110b. The correct answer information 110b is information that is given to each voice data and indicates whether a specific conversation situation is included. In the first embodiment, as an example, a specific conversation situation is referred to as an "abnormal conversation situation". An abnormal conversation situation includes an "unusual situation" in which a customer is dissatisfied, begins to be angry, or threatens.

The generation unit 120 acquires learning voice data from the learning voice database 110a. In the following description of the learning device 100, the learning voice data acquired from the learning voice database will be simply referred to as "voice data". The generation unit 120 performs, for example, a vector quantization on the voice data, and generates information (quantization sequence) of a result of the quantization. For example, the quantization sequence is an example of an index indicating a bias of vocalization. The generation unit 120 converts each quantization result into a One Hot vector, and outputs the One Hot vector of each quantization result to the first calculation unit 130.

The first calculation unit 130 is a processing unit that calculates an internal vector by sequentially inputting One Hot vectors of quantization results to a first network having a recursive path and performing a calculation based on parameters of the first network. For example, the first network corresponds to an LSTM (Long Short Term Memory). The first calculation unit 130 inputs the One Hot vector of the quantization result generated from the voice data into the first network, and outputs each internal vector obtained by the input to the third calculation unit 140.

The third calculation unit 140 is a processing unit that averages a plurality of internal vectors output from the first calculation unit 130. The third calculation unit 140 outputs the averaged internal vector to the second calculation unit 150. In the following description, the averaged internal vector is referred to as an "average vector".

The second calculation unit 150 is a processing unit that calculates an output value (neuron value) by inputting an average vector into a second network having no recursive path and performing a calculation based on parameters of the second network. The second calculation unit 150 outputs an output value to the learning unit 160.

When inputting the voice data to the first calculation unit 130, the learning unit 160 learns the parameters of the first calculation unit 130 and the parameters of the second calculation unit 150 so that the output value output from the second calculation unit 150 approaches the correct answer information 110b corresponding to the voice data (learning by an error back-propagation method).

The learning unit 160 repeatedly executes the error back-propagation learning until a learning stop condition is satisfied, and generates an LSTM model 110c and a DNN (Deep Neural Network) model 110d. The LSTM model 110c is information corresponding to the parameters of the learned first network. The DNN model 110d is information corresponding to the parameters of the learned second network. The learning device 100 notifies a determination device 200 of the information of the LSTM model 110c and the information of the DNN model 110d. The learning unit 160 may notify the determination device 200 of the information of the LSTM model 110c and the information of the DNN model 110d via a network, or may notify the determination device 200 of the information of the LSTM model 110c and the information of the DNN model 110d by directly coupling the learning device 100 and the determination device 200.

The determination device 200 includes a generation unit 220, a first calculation unit 230, a third calculation unit 240, a second calculation unit 250, and a determination unit 260.

The generation unit 220 receives input of voice data to be detected as to whether an abnormal conversation situation is present. In the following description of the determination device 200, the voice data to be detected as to whether an abnormal conversation situation is present is simply referred to as voice data. The generation unit 220 performs, for example, a vector quantization on the voice data, and generates information on a result of the quantization. The generation unit 220 converts each quantization result into a One Hot vector, and outputs the One Hot vector of each quantization result to the first calculation unit 230.

The first calculation unit 230 is a processing unit that calculates an internal vector by sequentially inputting One Hot vectors of quantization results into a first network having a recursive path and performing a calculation based on parameters of the first network. The first calculation unit 230 uses parameters of the LSTM model 110c as parameters to be set in the first network. The first calculation unit 230 inputs the One Hot vector of the quantization result generated from the voice data into the first network, and outputs each internal vector obtained by the input to the third calculation unit 240.

The third calculation unit 240 is a processing unit that averages a plurality of internal vectors output from the first calculation unit 230. The third calculation unit 240 outputs the averaged internal vector (average vector) to the second calculation unit 250.

The second calculation unit 250 is a processing unit that calculates an output value (neuron value) by inputting an average vector into a second network having no recursive path and performing a calculation based on parameters of the second network. The second calculation unit 250 uses parameters of the DNN model 110d as parameters to be set in the second network. The second calculation unit 250 outputs an output value to the determination unit 260.

The determination unit 260 is a processing unit that compares the output value output from the second calculation unit 250 with a threshold value to determine whether the voice data includes an abnormal conversation situation. For example, when the output value is equal to or larger than the threshold value, the determination unit 260 determines that the voice data includes an abnormal conversation situation.

As described above, the learning device 100 according to the first embodiment uses a set of the quantization result extracted from the learning voice data and the correct answer information to perform a machine learning of the LSTM model 110c and the DNN model 110d. For this reason, the LSTM model 110c and the DNN model 110d may be learned without using trial and error, skillful knowledge, and know-how for setting a keyword for detecting a specific conversation situation. In addition, the determination device 200 may appropriately determine whether a specific conversation situation is included in the voice data by using the learned LSTM model 110c and DNN model 110d to perform a process on the voice data.

[System Configuration]

Figure 3:
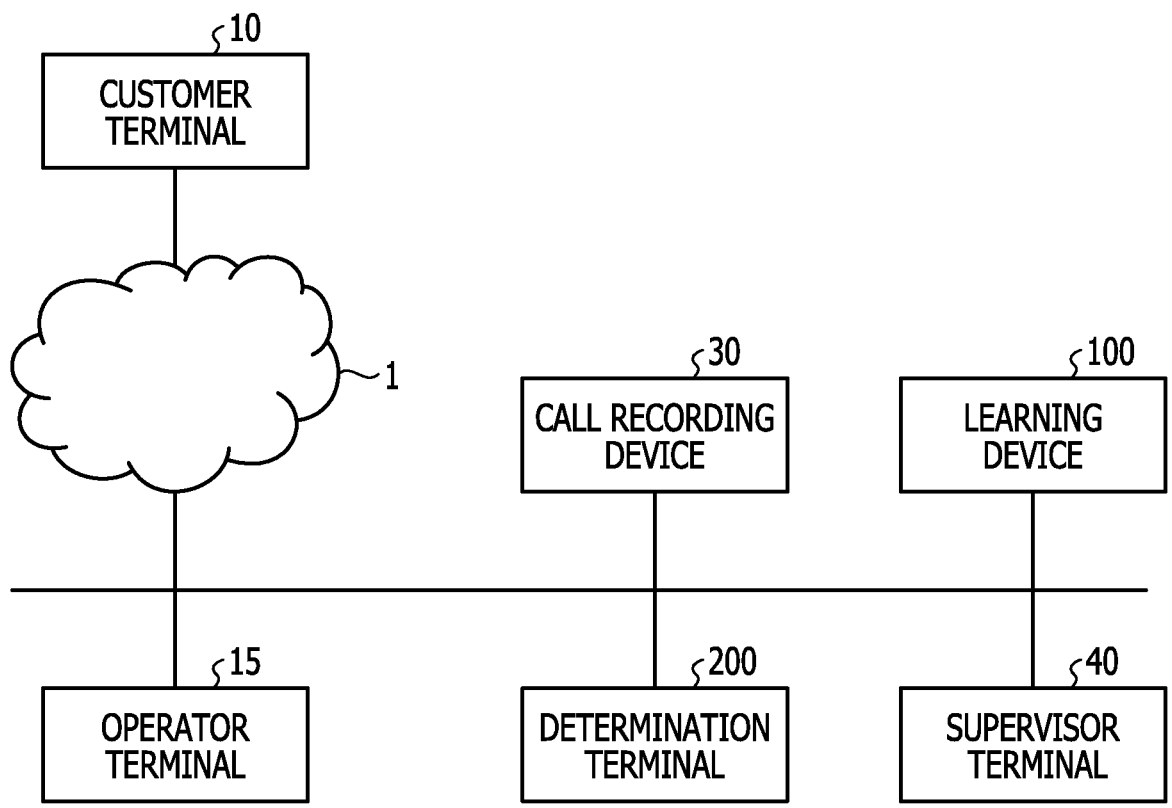
FIG. 3 is a diagram illustrating an example of a system according to the first embodiment.

Next, an example of a system according to the first embodiment will be described. FIG. 3 is a diagram illustrating an example of a system according to the first embodiment. As illustrated in FIG. 3, this system includes a customer terminal 10, an operator terminal 15, a call recording device 30, a supervisor terminal 40, a learning device 100, and a determination device 200.

The customer terminal 10 and the operator terminal 15 are coupled to each other via a network 1 such as an IP (Internet Protocol) network. The operator terminal 15, the call recording device 30, the supervisor terminal 40, the learning device 100, and the determination device 200 are also coupled to each other by a predetermined network. Various wired or wireless communication networks such as the Internet, dedicated lines, and the like may be adopted for each network.

The customer terminal 10 is a terminal device used by a customer to talk (call) with an operator. The operator terminal 15 is a terminal device used by an operator to talk with a customer.

The call recording device 30 is a device that records the voice of conversation transmitted and received between the customer terminal 10 and the operator terminal 15. During learning, voice data recorded by the call recording device 30 is notified to the learning device 100 and is used as learning voice data. When an abnormal conversation is detected, the voice data recorded by the call recording device 30 is notified to the determination device 200 where it is determined whether the voice data includes an abnormal conversation situation.

The supervisor terminal 40 is a terminal device used by a supervisor who uses the operator terminal 15 to manage an operator who talks with a customer. For example, when the determination device 200 determines that a conversation between a customer and an operator includes an abnormal conversation situation, the determination device notifies the supervisor terminal 40 of information indicating that the abnormal conversation situation is detected.

The learning device 100 is a device that uses the learning voice data and the correct answer information to learn the LSTM model 110c and the DNN model 110d. The learning device 100 notifies the determination device 200 of information about the learned LSTM model 110c and DNN model 110d.

The determination device 200 is a device that uses the LSTM model 110c and the DNN model 110d notified from the learning device 100 to determine whether the conversation between the customer terminal 10 and the operator terminal 15 includes an abnormal conversation situation. When determining that the conversation between the customer and the operator includes an abnormal conversation situation, the determination device 200 notifies the supervisor terminal 40 of information indicating that the abnormal conversation situation is detected.

[Functional Configuration of Learning Device]

Figure 4:
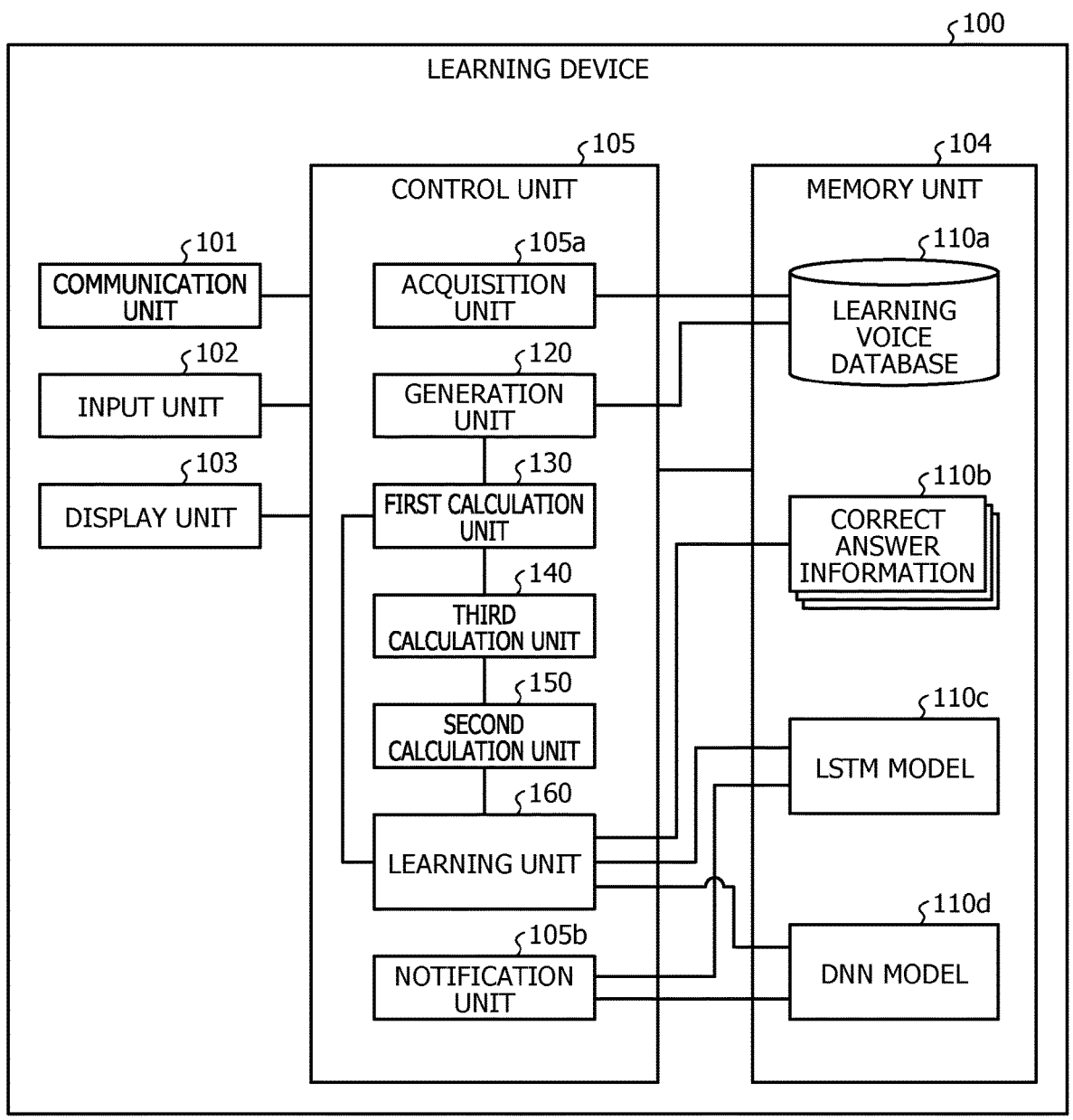
FIG. 4 is a functional block diagram illustrating the configuration of the learning device according to the first embodiment.

Next, an example of the configuration of the learning device 100 illustrated in FIG. 3 will be described. FIG. 4 is a functional block diagram illustrating the configuration of the learning device according to the first embodiment. As illustrated in FIG. 4, the learning device 100 includes a communication unit 101, an input unit 102, a display unit 103, a memory unit 104, and a control unit 105.

The communication unit 101 is a processing unit that performs data communication with the call recording device 30 and the determination device 200. The control unit 105 to be described later exchanges data with the call recording device 30 and the determination device 200 via the communication unit 101. The communication unit 101 is an example of a communication device (see FIG. 25).

The input unit 102 is an input device for inputting a variety of information to the learning device 100. The input unit 102 corresponds to a keyboard, a mouse, a touch panel, or the like.

The display unit 103 is a device that displays information output from the control unit 105. The display unit 103 corresponds to a liquid crystal display, a touch panel, or the like.

The memory unit 104 includes a learning voice database 110a, correct answer information 110b, an LSTM model 110c, and a DNN model 110d. The memory unit 104 corresponds to a semiconductor memory device such as a RAM (Random Access Memory), a flash memory, or the like, and a memory device as an HDD (Hard Disk Drive) or the like.

The learning voice database 110a is a database that stores a plurality of learning voice data. Each voice data stored in the learning voice database 110a is voice data of a conversation between a customer and an operator.

The correct answer information 110b is information that is given to each voice data stored in the learning voice database 110a and indicates whether an abnormal conversation situation is included.

The LSTM model 110c is information corresponding to the parameters of the first network (LSTM). The DNN model 110d is information corresponding to the parameters of the second network (DNN). The LSTM model 110c and the DNN model 110d are learned by the machine learning unit 160.

The control unit 105 includes an acquisition unit 105a, a notification unit 105b, a generation unit 120, a first calculation unit 130, a third calculation unit 140, a second calculation unit 150, and a learning unit 160. The control unit 105 may be implemented by a CPU (Central Processing Unit), an MPU (Micro Processing Unit), or the like. The control unit 105 may also be implemented by hard-wired logic such as an ASIC (Application Specific Integrated Circuit), a FPGA (Field Programmable Gate Array), or the like.

The acquisition unit 105a is a processing unit that acquires information of the learning voice database 110a from the call recording device 30. The acquisition unit 105a stores the information of the learning voice database 110a in the memory unit 104. Further, when acquiring the correct answer information 110b, the acquisition unit 105a stores the acquired correct answer information 110b in the memory unit 104. The correct answer information 110b may be associated with each voice data of the learning voice database 110a in advance.

The notification unit 105b is a processing unit that notifies the determination device 200 of the learned LSTM model 110c and the learned DNN model 110d.

The generation unit 120 is a processing unit that acquires the learning voice data from the learning voice database 110a and generates information of a quantization result based on the voice data.

Figure 5:
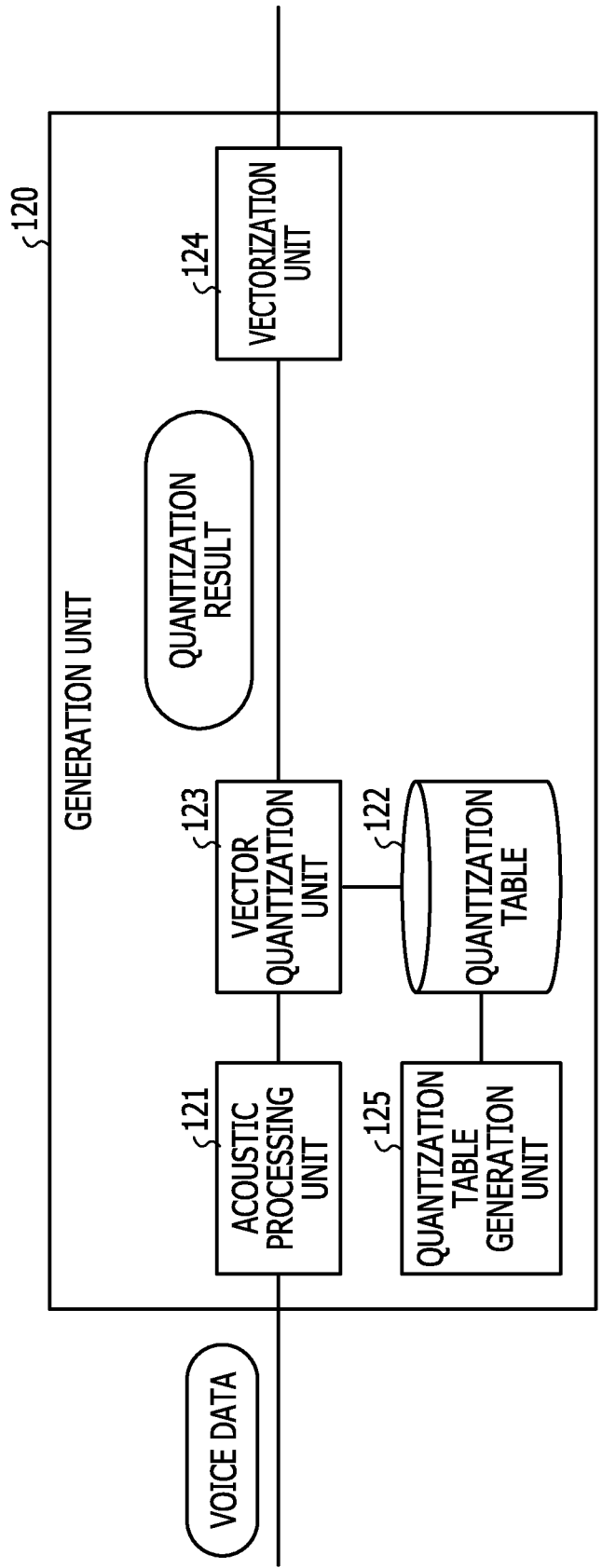
FIG. 5 is a diagram for explaining a generation unit according to the first embodiment.

FIG. 5 is a diagram for explaining the generation unit according to the first embodiment. As illustrated in FIG. 5, the generation unit 120 includes an acoustic processing unit 121, a quantization table 122, a vector quantization unit 123, a vectorization unit 124, and a quantization table generation unit 125.

The acoustic processing unit 121 is a processing unit that extracts information to be used for speech recognition from the voice data. The information extracted from the voice data is called a feature. The acoustic processing unit 121 sets a short section, called a frame of about 32 ms in the voice data, and extracts a feature while shifting about 10 ms. For example, the acoustic processing unit 121 extracts a feature from the voice data based on MFCC (Mel-Frequency Cepstrum Coefficients). The acoustic processing unit 121 outputs the feature to the vector quantization unit 123.

The quantization table 122 is a vector table that is used for quantization of the voice data. The quantization table 122 is a plurality of representative points of the feature of utterance data, and uses each voice data for adaptive processing of the quantization table 122 to be optimized in advance in a quantization table generation unit 125.

Figure 6:
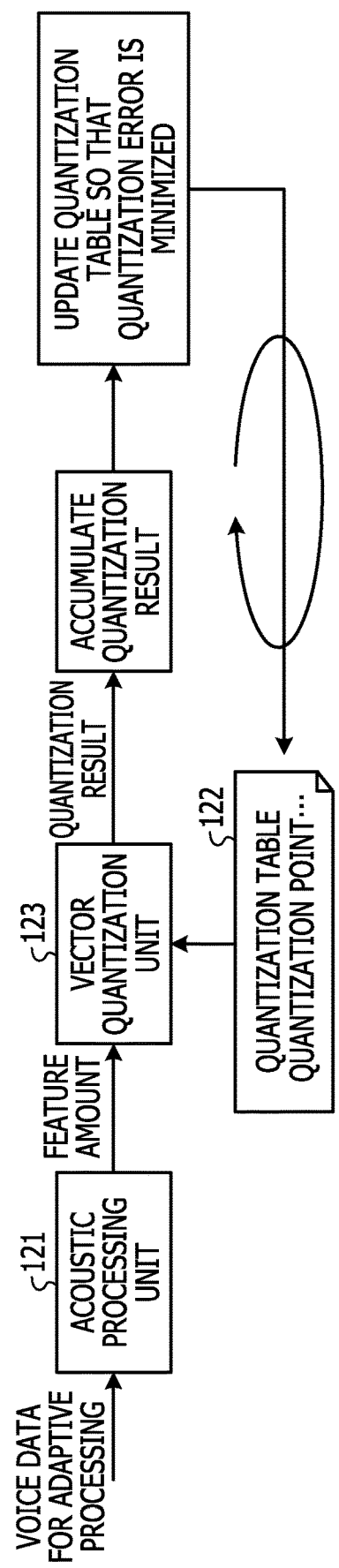
FIG. 6 is a diagram for explaining a quantization table generation unit that generates a quantization table.

FIG. 6 is a diagram for explaining the quantization table generation unit 125 that generates the quantization table 122. As illustrated in FIG. 6, when the quantization table 122 is optimized, the quantization table generation unit 125 of the generation unit 120 of the learning device 100 executes an acoustic analysis on each voice data for adaptive processing, and generates a feature in the acoustic processing unit 121. Then, the quantization table generation unit 125 matches each feature generated from each voice data with the quantization table 122 to accumulate the quantization results, and optimizes the quantization table 122 by repeating the update of the quantization table 122 so that a quantization error is minimized.

Figure 7:
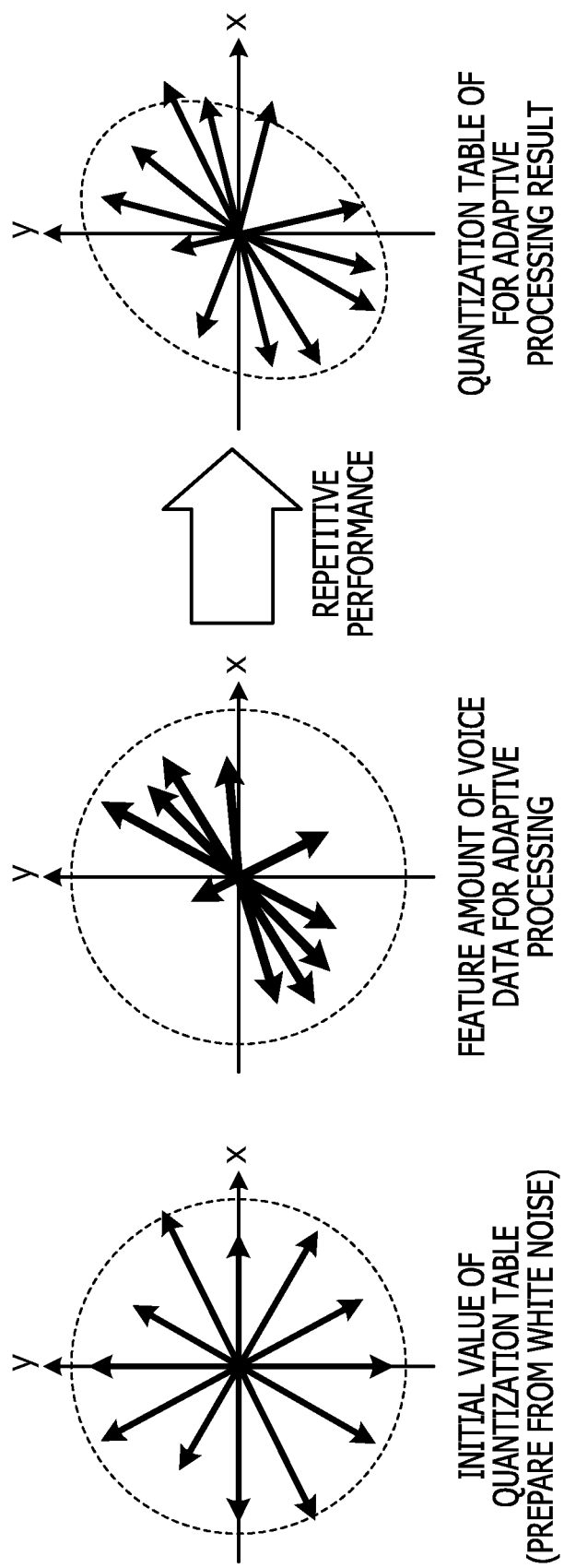
FIG. 7 is a diagram for explaining the overall flow of adaptive control of the quantization table.

FIG. 7 is a diagram for explaining the overall flow of adaptive control of the quantization table 122 performed by the quantization table generation unit 125. Here, the feature is a two-dimensional feature. As illustrated in FIG. 7, the quantization table generation unit 125 generates an initial value of the quantization table 122 from white noise or the like, quantizes voice data for adaptive processing, updates each vector of the quantization table 122 by using the average of selected features, and reduces a quantization error by repeating this update. That is, the quantization table generation unit 125 repeats the update of the quantization table 122 to minimize the quantization error in accordance with a distribution of physical features of the voice data.

Figure 8:
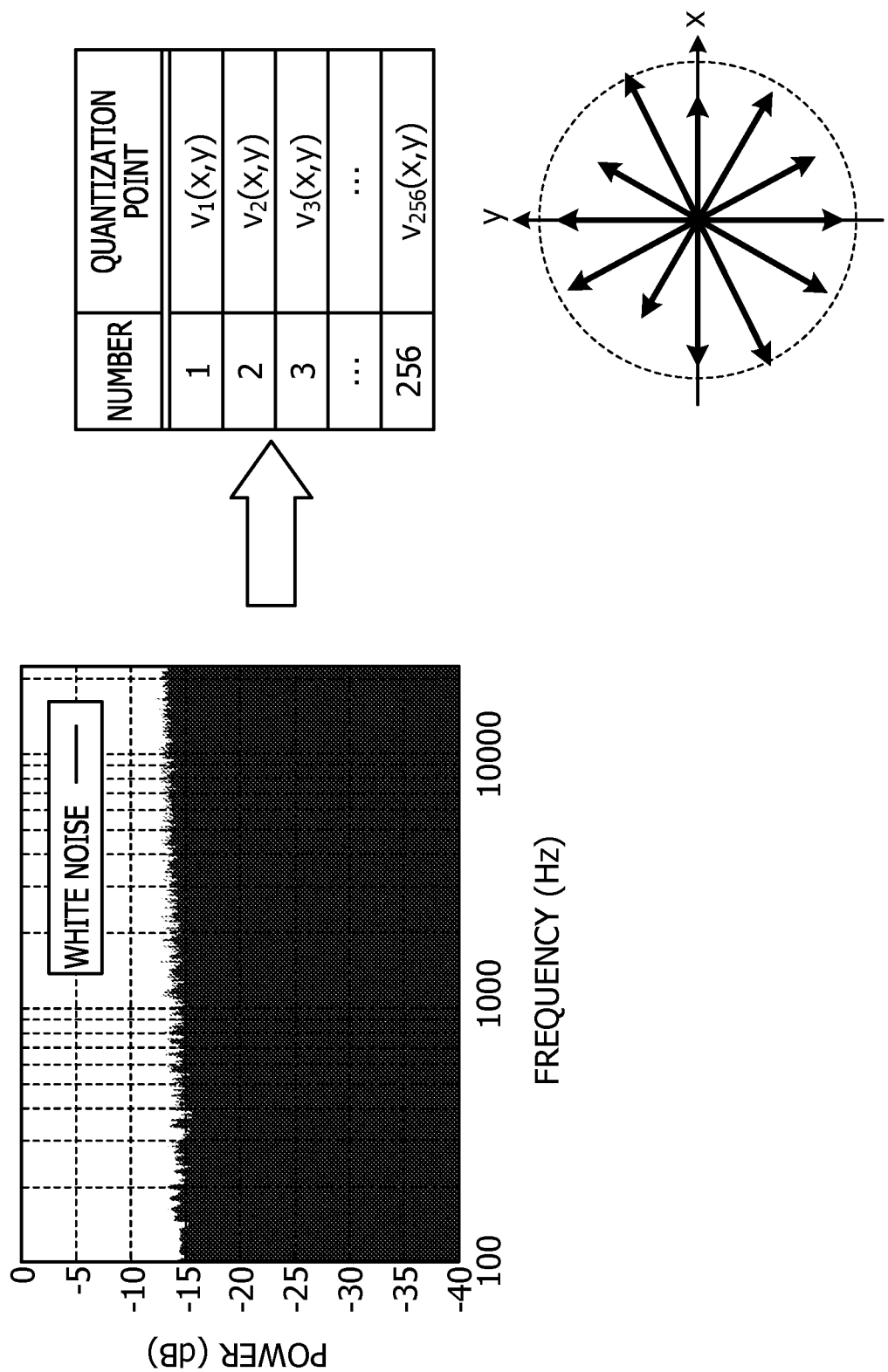
FIG. 8 is a diagram for explaining the initial values of the quantization table.

Next, the generation of the quantization table 122 in the quantization table generation unit 125 will be described in detail with reference to FIGS. 8 to 12. FIG. 8 is a diagram for explaining initial values of the quantization table 122. As illustrated in FIG. 8, the quantization table generation unit 125 generates a predetermined number (e.g., 256) of quantization points from a set of features of voice data having a small power bias on the frequency axis, such as white noise or the like. Specifically, the quantization table generation unit 125 calculates a set of features of sufficiently long white noise, sequentially selects from the results to generate quantization points $v1(x, y)$, $v2(x, y)$, ..., $v256(x, y)$, and associates the generated quantization points with quantization points number 1 to 256. It is here assumed that each quantization point is a vector having magnitude and direction. Therefore, when each quantization point is expressed in a two-dimensional feature space having x and y axes, it may be expressed by 256 vectors having different directions and magnitudes.

Subsequently, the quantization table generation unit 125 generates a feature from the adaptive processing voice data, calculates a distance (e.g., Euclidean distance) between a vector indicating the feature and a quantization point corresponding to each quantization point number, and selects the quantization point with the closest distance. Here, the quantization table generation unit 125 regards a vector most selected in the initial quantization table 122 as silence equivalent, and does not use the vector for other adaptation, but adapts so that there is one vector equivalent to silence. Further, the quantization table generation unit 125 updates each vector using the average of selected features during the adaptation of each feature, while the quantization table generation unit 125 rejects, without updating, a vector that has not relatively been selected in the quantization (e.g., lower ¼, etc.), and prepares and replaces a replacement vector. In this way, the quantization table generation unit 125 makes an adaptation so that there is no large deviation in the number of selections of each vector equivalent to other than silence.

Figure 9:
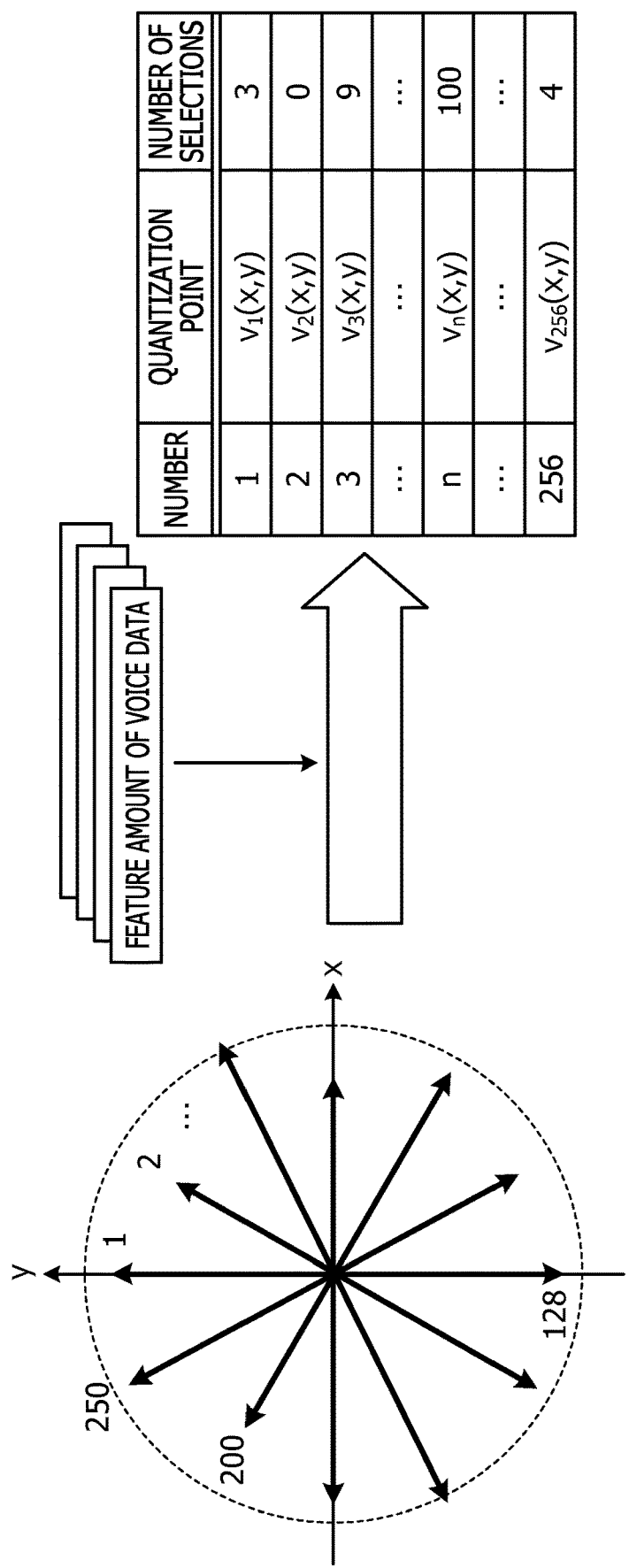
FIG. 9 is a diagram for explaining selection of a quantization point.

FIG. 9 is a diagram for explaining selection of quantization points. As illustrated in FIG. 9, the quantization table generation unit 125 executes an application of a window function, fast Fourier transform, or the like on a series of conversation data to generate each feature from each voice data divided into predetermined sections. Subsequently, the quantization table generation unit 125 calculates a distance between each feature and each quantization point of the quantization table 122, and selects the quantization point with the shortest distance. In this way, the quantization table generation unit 125 counts the number of selections of each quantization point.

Then, the quantization table generation unit 125 updates the quantization point. FIG. 10 is a diagram for explaining the update of the quantization table 122. The selection result of each quantization point in the initial quantization table 122 and the feature of the voice data for which the quantization point is selected are illustrated in FIG. 10.

Specifically, the quantization table generation unit 125 specifies the upper few quantization points with the larger selection count and the lower few quantization points with the smaller selection count. Then, the quantization table generation unit 125 rejects (discards) the lower quantization points, and inserts the upper quantization points instead of the lower quantization points. Meanwhile, the quantization table generation unit 125 updates quantization points other than the lower quantization points based on the feature of voice for which the quantization points are selected. However, the quantization table generation unit 125 excludes the quantization point equivalent to silence from the replacement target.

For example, the quantization table generation unit 125 determines that a quantization point (vn(x, y) of a quantization point number n that has been selected the most times is equivalent to silence, and excludes this quantization point from the replacement target. Subsequently, the quantization table generation unit 125 specifies the quantization points number 1, 2, etc. as the quantization points whose number of selections is the upper few, and specifies the quantization points number 3, 256, etc. as the quantization points whose number of selections is the lower few. Then, the quantization table generation unit 125 discards the quantization point (v3(x, y)) of the quantization point number 3 that is selected a small number of times, and inserts the quantization point (v1(x, y)) of the quantization point number 1 that is selected a large number of times. Similarly, the quantization table generation unit 125 discards the quantization point (v256(x, y)) of the quantization point number 256 that is selected a small number of times, and inserts the quantization point (v2(x, y)) of the quantization point number 2 that is selected a large number of times.

Further, the quantization table generation unit 125 updates the quantization point whose number of selections is other than the relatively lower numbers with the average value of the selected features. For example, for the quantization point (v2(x, y)) of the quantization point number 2, the quantization table generation unit 125 calculates the average value [v2'(x, y)] of each of the x-axis and the y-axis by the selection rate that is [total of selected features/number of selections]=[((x', y')+(x", y")+ . . . )/21]. Then, the quantization table generation unit 125 updates "v2(x, y)" of the quantization point number 2 to "v2'(x, y)". In this way, the quantization table generation unit 125 updates the quantization points other than the lower few quantization points that are selected a small number of times by the same method as the quantization point number 2.

Figure 11:
FIG. 11 is a diagram for explaining before and after update of the quantization table.

FIG. 11 is a diagram for explaining before and after update of the quantization table. As illustrated in FIG. 11, the quantization table generation unit 125 updates the quantization point of the quantization point number 1 from "v1 (x,y)" to "v1'(x,y)", updates the quantization point of the quantization point number 2 from "v2(x,y)" to "v2'(x,y)", and updates the quantization point of the quantization point number n equivalent to silence from "vn(x,y)" to "vn'(x,y)". Meanwhile, the quantization table generation unit 125 updates the quantization point "v3(x,y)" of the quantization point number 3 with a small number of selections with the quantization point "v1(x,y)" of the quantization point number 1 before update, and the quantization point "v256(x,y)" of the quantization point number 256 with the quantization point "v2(x,y)" of the quantization point number 2 before update.

In this way, the quantization table generation unit 125 calculates a quantization error by updating the quantization table 122 using each voice data of a series of conversation data for adaptive processing. Then, when the quantization error is equal to or larger than the threshold value, the quantization table generation unit 125 executes the same update process using different or same conversation data for adaptive processing. When the quantization error is smaller than the threshold value, the quantization table generation unit 125 determines that an "efficient table" has been generated, terminates the update process, and saves the quantization table 122 at that time.

Figure 12:
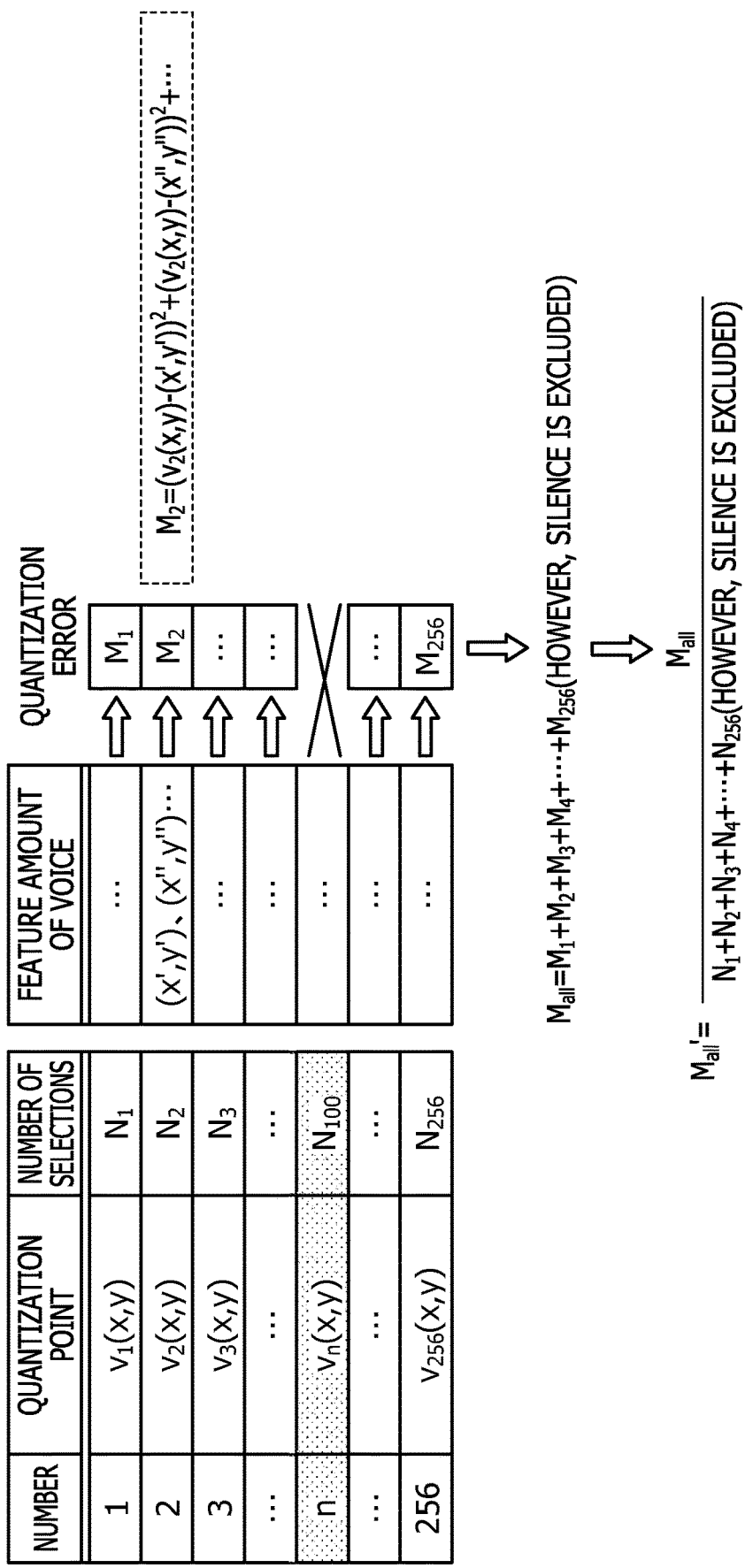
FIG. 12 is a diagram for explaining a determination method based on a quantization error.

FIG. 12 is a diagram for explaining a determination method based on a quantization error. In the example of FIG. 12, it is assumed that the number of selections of the quantization point "v1(x,y)" of the quantization point number 1 is "N1", the number of selections of the quantization point "v2(x,y)" of the quantization point number 2 is "N2", . . . , and the number of selections of the quantization point "v256(x, y)" of the quantization point number 256 is "N256". In such a state, the quantization table generation unit 125 calculates a quantization error "M1" for the quantization point number 1, a quantization error "M2" for the quantization point number 2, . . . , and a quantization error "M256" for the quantization point number 256.

For example, when the quantization point number 2 is taken as an example, the quantization table generation unit 125 calculates, as a quantization error "M2", the total value of differences between the quantization point "v2(x, y)" and the features, "(v2(x,y)−(x',y'))2+(v2(x,y)−(x",y"))2+, . . . ". Then, the quantization table generation unit 125 calculates "Mall=M1+M2+M3+, . . . , +M256" as the sum "Mall" of the respective quantization errors. However, the quantization point number n equivalent to silence is excluded. That is, "Mall" is the total value of 255 pieces.

Subsequently, the quantization table generation unit 125 calculates, as a quantization error "Mall'", "Mall/(N1+N2+N3+, . . . , +N256)", which is obtained by dividing the sum "Mall" of the respective quantization errors by the sum of the number of selections of each quantization point. However, the quantization point number n equivalent to silence is excluded. That is, the denominator of the above calculation formula is the total value of 255 pieces.

Then, the quantization table generation unit 125 continues to update the quantization table 122 when the quantization error "Mall'" is equal to or greater than the threshold value, and ends updating of the quantization table 122 when the quantization error "Mall'" is smaller than the threshold value. In this way, the quantization table generation unit 125 generates the quantization table 122 as a vector table used for quantization.

Referring back to FIG. 5, the vector quantization unit 123 is a processing unit that collates the quantization table 122 with the feature, and based on each quantization result (e.g., corresponding to the quantization point number) corresponding to each quantization point, executes a process of outputting a quantization result corresponding to a feature each time the feature is received from the acoustic processing unit 121. The vector quantization unit 123 outputs, to the vectorization unit 124, information on a quantization sequence in which the quantization results corresponding to the respective features are arranged in time series.

The vectorization unit 124 is a processing unit that converts each quantization result included in the quantization sequence into a vector. The vectorization unit outputs each vector corresponding to each quantization result of the quantization sequence to the first calculation unit 130. For example, the vectorization unit 124 represents each quantization result as a 40-dimensional One Hot vector. For the One Hot vector of the input quantization result, "1" is set to the dimension of the input quantization result, and "0" is set to the other dimensions.

Figure 13:
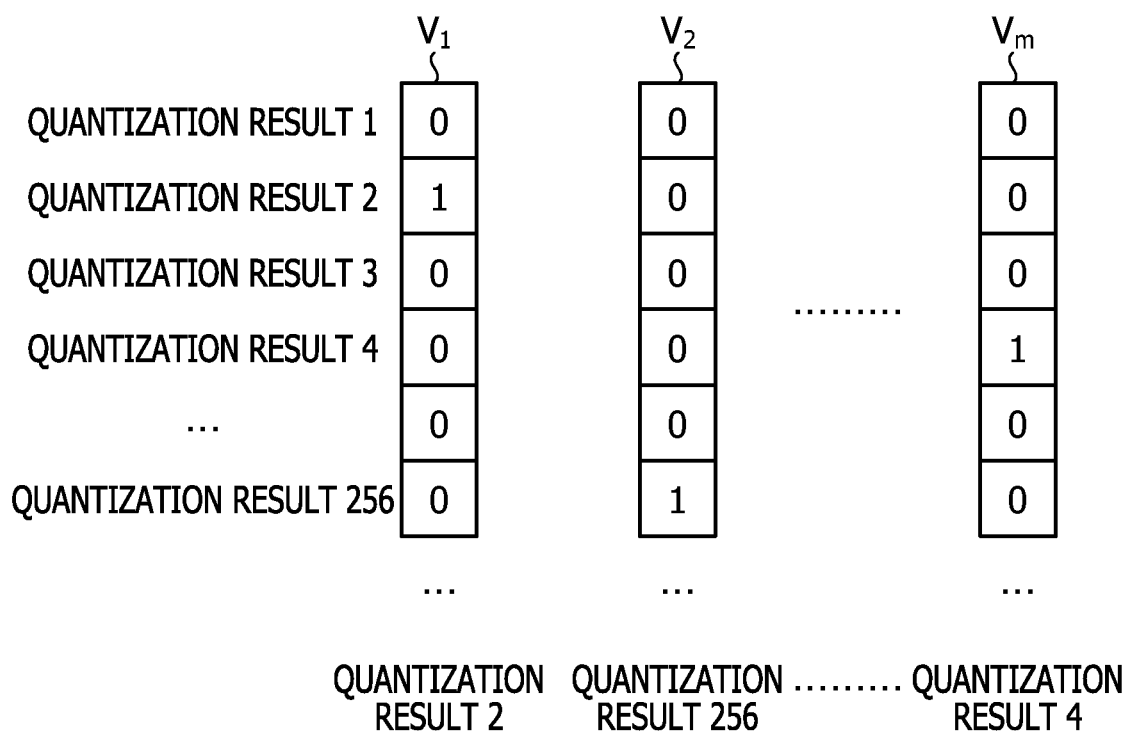
FIG. 13 is a diagram for explaining a process of a vectorization unit according to the first embodiment.

FIG. 13 is a diagram for explaining a process of the vectorization unit according to the first embodiment. For example, when a quantization result 1, a quantization result 2, . . . , and a quantization result 256 are sequentially input, the vectorization unit 124 generates One Hot vectors V1, V2, . . . , and Vm. For the One Hot vector V1, "1" is set to the dimension corresponding to the quantization result 2, and "0" is set to the other dimensions. For the One Hot vector V2, "1" is set in the dimension corresponding to the quantization result 256, and "0" is set in the other dimensions. For the One Hot vector Vm, "1" is set to the dimension corresponding to the quantization result 4, and "0" is set to the other dimensions.

Reference is made to the explanation of FIG. 4. The first calculation unit 130 is a processing unit that calculates an internal vector by sequentially inputting One Hot vectors of quantization results into the first network having a recursive path and performing a calculation based on the parameters of the first network.

Figure 14:
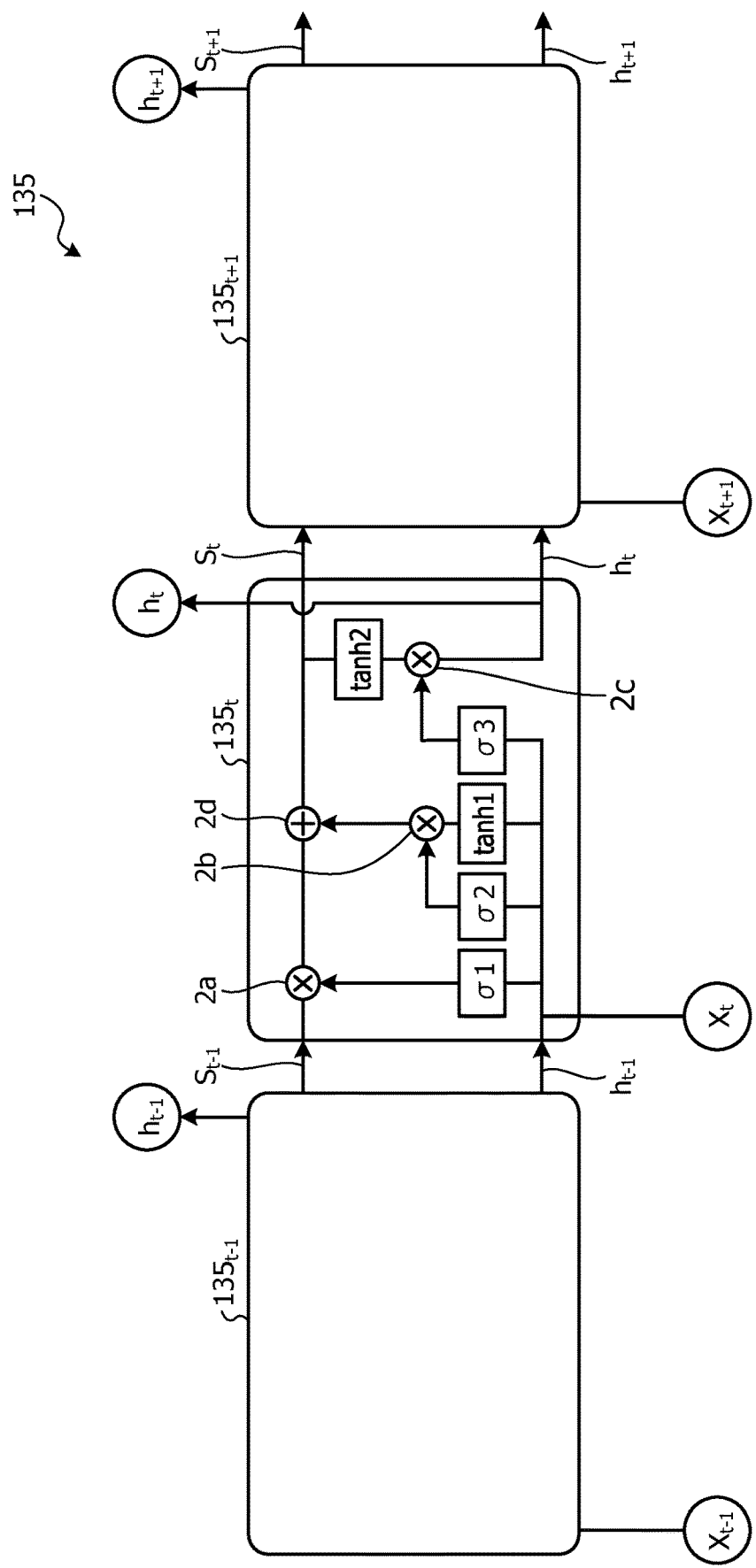
FIG. 14 is a diagram illustrating an example of LSTM according to the first embodiment.

The first calculation unit 130 uses an LSTM as the first network. FIG. 14 is a diagram illustrating an example of the LSTM according to the first embodiment. One LSTM 135 has three sets of weight matrix and bias (corresponding to three coupled one-layer ford forward type neural networks). The value of the weight matrix and the value of the bias are parameters to be learned by the LSTM 135.

The LSTM 135 has σ1, σ2, and σ3, switches 2a, 2b, and 2c, an addition unit 2d, tan h1, and tan h2. The σ1 to σ3 are processing units that perform an affine transformation by multiplying an input vector by a weight matrix and output an affine-transformed vector. The switches 2a to 2c are processing units that control ON/OFF for each dimension of a vector passing through a gate according to the value of each dimension of an input vector. For example, the switches 2a to 2c control ON/OFF based on a sigmoid function or the like. The addition unit 2d is a processing unit that outputs a value obtained by adding vectors input from two directions for each dimension. The tan h1 and tan h2 are processing units that perform a calculation based on a tan h function on an input vector and output a result of the calculation.

In FIG. 14, "Xt" indicates a One Hot vector of a quantization result at time t. For the sake of convenience, at time t−1, the LSTM 135 at the time when a One Hot vector "Xt−1" of the quantization result is input is expressed as an LSTM 135t−1. At time t, the LSTM 135 at the time when a One Hot vector "Xt" of the quantization result is input is expressed as an LSTM 135t. At time t+1, the LSTM 135 at the time when a One Hot vector "Xt+1" of the quantization result is input is expressed as an LSTM 135t+1.

As an example, descriptions will be given using the LSTM 135t. When "Xt" is input, a vector obtained by adding ht−1 input from the LSTM 135t−1 and Xt is input to the σ1, σ2, and σ3 and the tan h1. The ht−1 is an internal vector calculated by the LSTM 135 at time t−1.

The switch 2a controls ON/OFF of a gate through which St−1 passes, based on a vector output from the σ1. The switch 2b controls ON/OFF of a gate through which a vector output from the tan h1 passes, based on a vector output from the σ2. The switch 2c controls ON/OFF of a gate through which a vector St output from the addition unit 2d passes, based on a vector output from the σ3. A vector output from the switch 2c becomes an internal vector ht at time t. The internal vector ht is input to the LSTM 135t+1.

The addition unit 2d is a processing unit that calculates the vector St obtained by adding a vector output from the switch 2a and a vector output from the switch 2b. The vector St is input to the LSTM 135t and the tan h2.

The first calculation unit 130 calculates a plurality of internal vectors h by sequentially inputting One Hot vectors of all the quantization results included in the quantization sequence into the LSTM 135 described with reference to FIG. 14. The first calculation unit 130 outputs the plurality of internal vectors h to the third calculation unit 140.

The third calculation unit 140 is a processing unit that averages the plurality of internal vectors h output from the first calculation unit 130. The third calculation unit 140 outputs the averaged internal vector (average vector) to the second calculation unit 150.

The second calculation unit 150 is a processing unit that calculates an output value (neuron value) by inputting an average vector into a second network having no recursive path and performing a calculation based on parameters of the second network.

Figure 15:
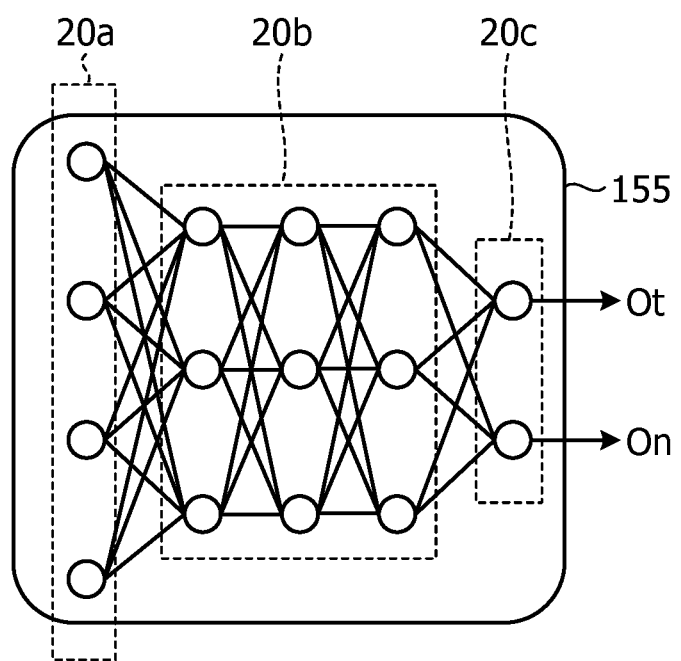
FIG. 15 is a diagram for explaining an example of a neural network according to the first embodiment.

For example, the second network is a feed forward type neural network. FIG. 15 is a diagram for explaining an example of the neural network according to the first embodiment. As illustrated in FIG. 15, the neural network 155 has an input layer 20a, a hidden layer 20b, and an output layer 20c. The input layer 20a, the hidden layer 20b, and the output layer 20c have a structure in which a plurality of nodes is coupled by an edge. The hidden layer 20b and the output layer 20c have a function called an activation function and a bias value, and the edge has a weight. The bias value and the weight are parameters to be learned by the second network.

When the average vector is input to each node included in the input layer 20a, the probability "Ot" that a conversation is in an abnormal conversation situation and the probability "On" that the conversation is in a normal conversation situation are output from each node of the output layer 20c through the hidden layer 20b. For example, the output layer 20c is randomized by Softmax, and the sum of the output value of "Ot" and the output value of "On" becomes "1.0".

Reference is made to the explanation of FIG. 4. The learning unit 160 is a processing unit that learns the parameters of the first calculation unit 130 and the parameters of the second calculation unit 150 so that the output value output from the second calculation unit 150 via the third calculation unit 140 approaches the correct answer information 110b corresponding to the voice data when the One Hot vector of each quantization result generated from the voice data is input into the first calculation unit 130.

For example, when the One Hot vector of each quantization result generated from the voice data corresponding to the correct answer information "abnormal conversation state" is input to the first calculation unit 130, the learning unit 160 learns the parameters so that the probability "Ot" approaches "1" and the probability approaches "On" approaches "0". When the One Hot vector of each quantization result generated from the voice data corresponding to the correct answer information "normal conversation state"

is input into the first calculation unit 130, the learning unit 160 learns the parameters so that the probability "Ot" approaches "0" and the probability approaches "On" approaches "1".

The learning unit 160 uses, for example, Cross Entropy as a loss function including a difference between a value output from Ot and the correct answer value and a difference between a value output from On and the correct answer value. The learning unit 160 repeatedly performs a parameter learning by back-propagating an error of the loss function so that the value of the loss function becomes the minimum value. The learning unit 160 sets the learning stop condition and ends the learning when the learning stop condition is satisfied. For example, the learning stop condition is a condition such that the value of the loss function is smaller than a threshold value.

The learning unit 160 stores information on the learning result of the parameters of the LSTM 135 in the memory unit 104 as the LSTM model 110c. The learning unit 160 stores information on the learning result of the parameters of the neural network 155 in the memory unit 104 as the DNN model 110d.

[Functional Configuration of Determination Device]

Figure 16:
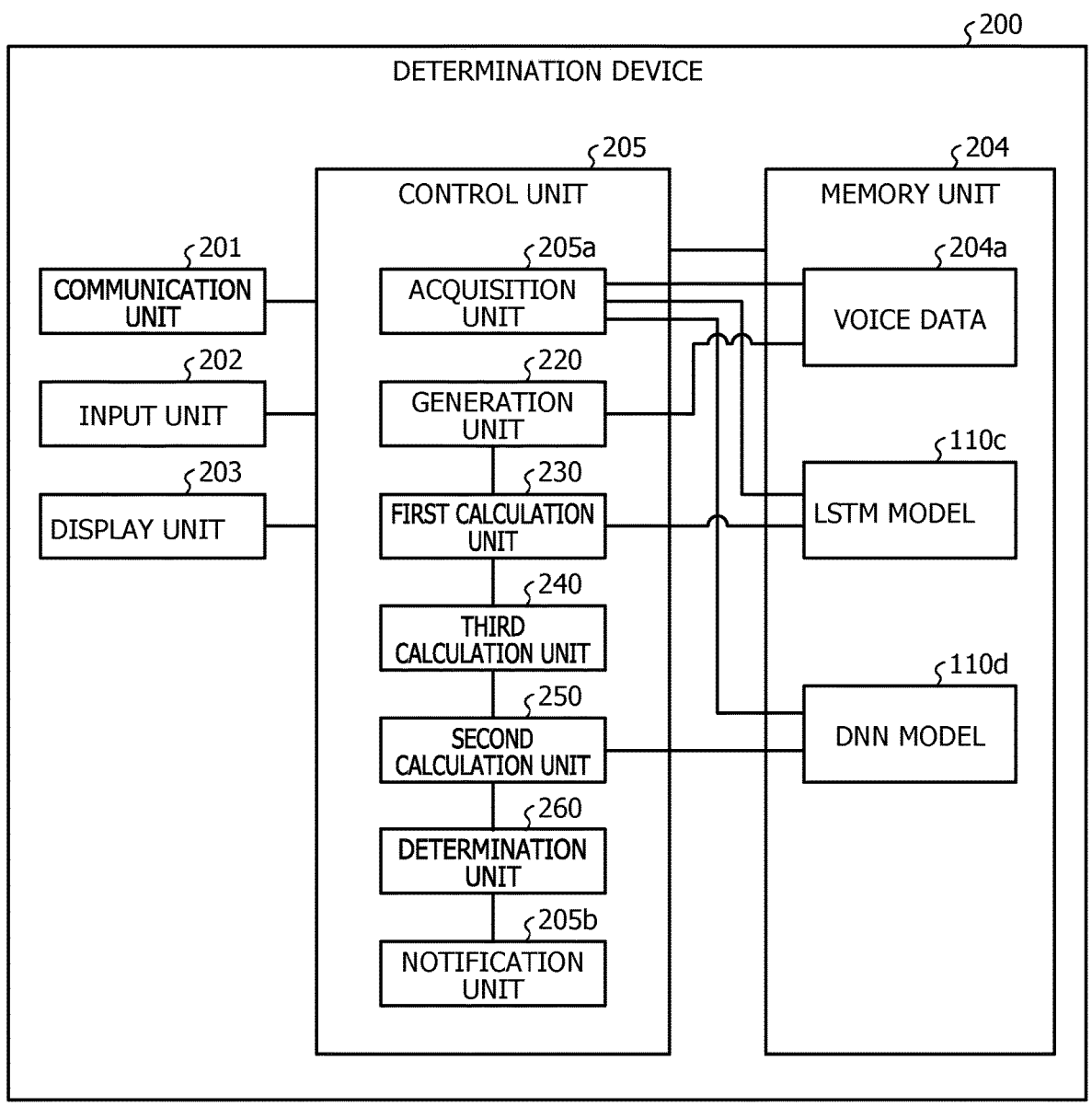
FIG. 16 is a functional block diagram illustrating the configuration of the determination device according to the first embodiment.

Next, an example of the configuration of the determination device 200 illustrated in FIG. 3 will be described. FIG. 16 is a functional block diagram illustrating the configuration of the determination device according to the first embodiment. As illustrated in FIG. 16, the determination device 200 includes a communication unit 201, an input unit 202, a display unit 203, a memory unit 204, and a control unit 205. Although not illustrated, the determination device 200 may be coupled to a microphone for acquiring voice data.

The communication unit 201 is a processing unit that performs data communication with the call recording device 30 and the learning device 100. The control unit 205 to be described later exchanges data with the call recording device 30 and the learning device 100 via the communication unit 201. The communication unit 201 is an example of a communication device (see FIG. 25).

The input unit 202 is an input device for inputting a variety of information into the determination device 200. The input unit 202 corresponds to a keyboard, a mouse, a touch panel, or the like.

The display unit 203 is a device that displays information output from the control unit 205. The display unit 203 corresponds to a liquid crystal display, a touch panel, or the like.

The memory unit 204 has voice data 204a, an LSTM model 110c, and a DNN model 110d. The memory unit 204 corresponds to a semiconductor memory device such as a RAM, a flash memory, or the like, or a memory device such as an HDD or the like.

The voice data 204a is voice data of a conversation between a customer and an operator, which is recorded by the call recording device 30, and is voice data that is the target of detection of an abnormal conversation situation.

The LSTM model 110c is information corresponding to the parameters of the first network (LSTM 135), learned by the learning device 100.

The DNN model 110d is information corresponding to the parameters of the second network (neural network 155), learned by the learning device 100.

The control unit 205 includes an acquisition unit 205a, a notification unit 205b, a generation unit 220, a first calculation unit 230, a third calculation unit 240, a second calculation unit 250, and a determination unit 260. The control unit 205 may be implemented by a CPU, a MPU, or the like. The control unit 205 may also be implemented by hard-wired logic such as an ASIC, a FPGA, or the like.

The acquisition unit 205a is a processing unit that acquires the voice data 204a from the call recording device 30. The acquisition unit 205a stores the voice data 204a in the memory unit 204. In addition, the acquisition unit 205a acquires, from the learning device 100, information on the learned LSTM model 110c and information on the DNN model 110d. The acquisition unit 205a stores the information of the LSTM model 110c and the information of the DNN model 110d in the memory unit 204.

The notification unit 205b acquires the determination result from the determination unit 260 to be described later. When the determination unit 260 determines that the voice data 204a includes an abnormal conversation situation, the notification unit 205b notifies the supervisor terminal 40 of information indicating that an abnormal conversation is included.

The generation unit 220 is a processing unit that acquires the voice data 204a and generates information of a quantization sequence based on the voice data 204a. Similarly to the generation unit 120 of the learning device 100, the generation unit 220 generates a quantization sequence from the voice data 204a and generates a One Hot vector of each quantization result. The generation unit 220 outputs the One Hot vector of each quantization result to the first calculation unit 230.

The first calculation unit 230 is a processing unit that calculates an internal vector by sequentially inputting One Hot vectors of quantization results into the first network having a recursive path and performing a calculation based on the parameters of the first network. The first network used by the first calculation unit 230 corresponds to the LSTM 135 described with reference to FIG. 14. The first calculation unit 230 sets the parameters of the LSTM model 110c to the parameters of the LSTM 135 and calculates the internal vector. The first calculation unit 230 outputs the internal vector h calculated from the One Hot vector of each quantization result to the second calculation unit 250.

The third calculation unit 240 is a processing unit that averages a plurality of internal vectors h output from the first calculation unit 230. The third calculation unit 240 outputs the averaged internal vector (average vector) to the second calculation unit 250.

The second calculation unit 250 is a processing unit that calculates an output value (neuron value) by inputting the average vector into the second network having no recursive path and performing a calculation based on the parameters of the second network. The second network used by the second calculation unit 250 corresponds to the neural network 155 described with reference to FIG. 15. The second calculation unit 250 sets the parameters of the DNN model 110d to the parameters of the neural network 155, and calculates the probability "Ot" that a conversation is in an abnormal conversation situation and the probability "On" that the conversation is in a normal conversation situation. The second calculation unit 250 outputs information of the probability "Ot" to the determination unit 260.

The determination unit 260 is a processing unit that determines whether the voice data 204a includes an abnormal conversation situation, based on the probability "Ot" of the abnormal conversation situation. For example, when the probability "Ot" is equal to or larger than a preset threshold value, the determination unit 260 determines that the voice data 204a includes an abnormal conversation situation. The determination unit 260 outputs a result of the determination to the notification unit 205b. In this example, although the determination is made based on the probability "Ot" of the abnormal conversation situation, a difference or ratio between the probability "Ot" of the abnormal conversation situation and the probability "On" of the normal conversation situation may be used as the value used for the determination.

[Flow of Generation Process of Quantization Table]

Figure 17:
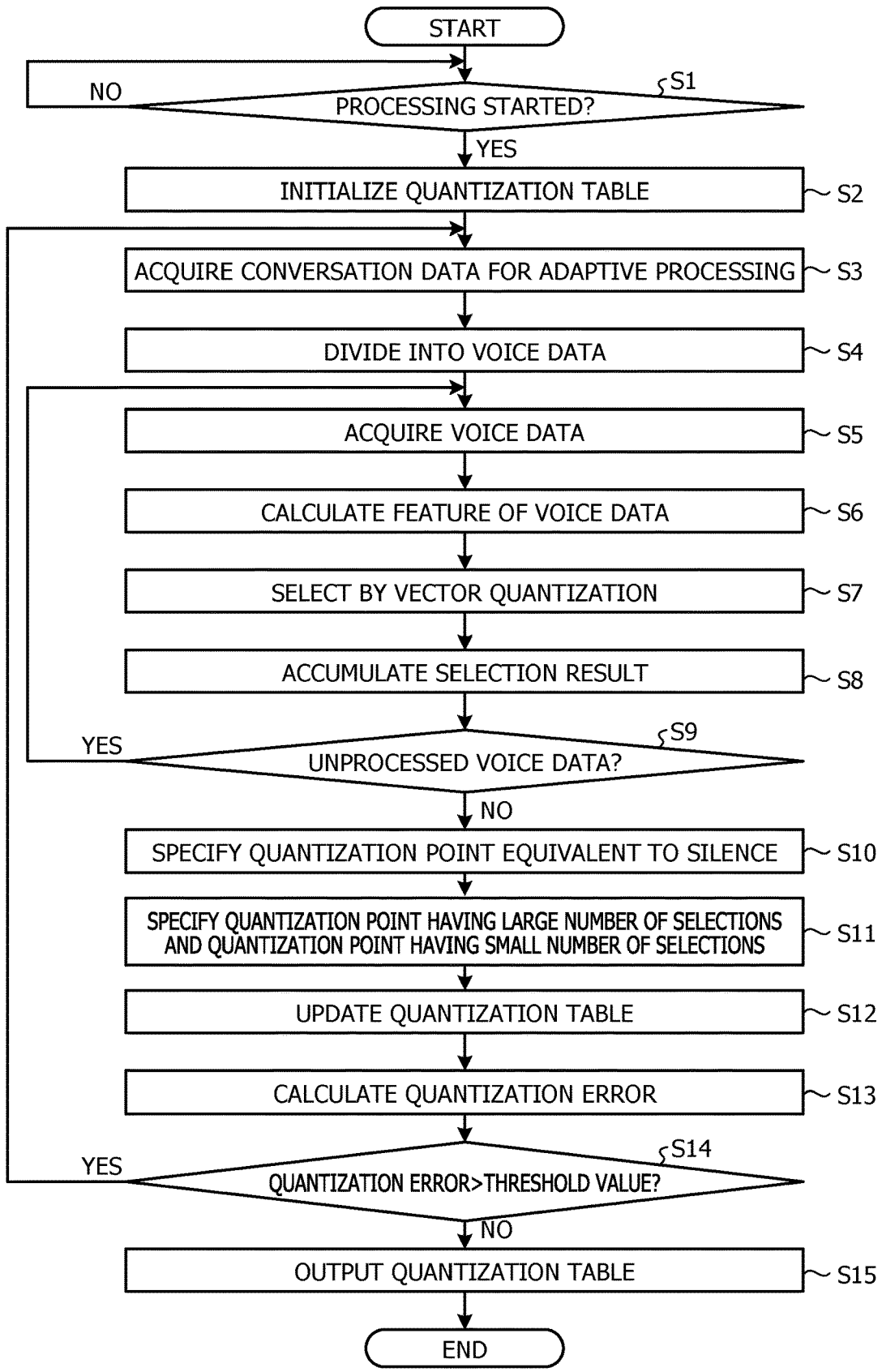
FIG. 17 is a flowchart illustrating a flow of generation process of the quantization table according to the first embodiment.

FIG. 17 is a flowchart illustrating a flow of generation process of the quantization table 122 according to the first embodiment. As illustrated in FIG. 17, when a process start is instructed ("Yes" in operation S1), the generation unit 120 executes initialization of the quantization table 122 (operation S2).

Subsequently, the generation unit 120 acquires conversation data for adaptive processing (operation S3) and divides such data into voice data (operation S4). Then, the generation unit 120 acquires one voice data (operation S5) and calculates a feature of the voice data (operation S6).

Thereafter, the generation unit 120 executes a selection by vector quantization (operation S7) and accumulates a result of the selection (operation S8). That is, the generation unit 120 calculates a distance between each quantization point of the quantization table 122 and the feature of the voice data, and selects the quantization point with the shortest distance.

Here, when there is unprocessed voice data ("Yes" in operation S9), the generation unit 120 repeats the operation S5 and the subsequent steps for the next voice data. Meanwhile, when there is no unprocessed voice data ("No" in operation S9), the generation unit 120 identifies the quantization point (quantization result) equivalent to silence based on the selection result of the quantization table 122 (operation S10). When the silence has been already specified, operation S10 is omitted.

Subsequently, the generation unit 120 specifies a quantization point having a large number of selections and a quantization point having a small number of selections (operation S11), and updates the quantization table 122 (operation S12). That is, the generation unit 120 changes a quantization point having a small number of selections to a quantization point before update having a large number of selections other than the quantization point equivalent to silence, and updates the other quantization points to the average of the features.

Thereafter, the generation unit 120 calculates a quantization error (operation S13), and when the quantization error is equal to or greater than the threshold value ("Yes" in operation S14), repeats operation S3 and the subsequent steps for the same or different conversation data. Meanwhile, when the quantization error is smaller than the threshold value ("No" in operation S14), the generation unit 120 ends the process and outputs the quantization table 122 (operation S15).

[Flow of Learning Process]

Figure 18:
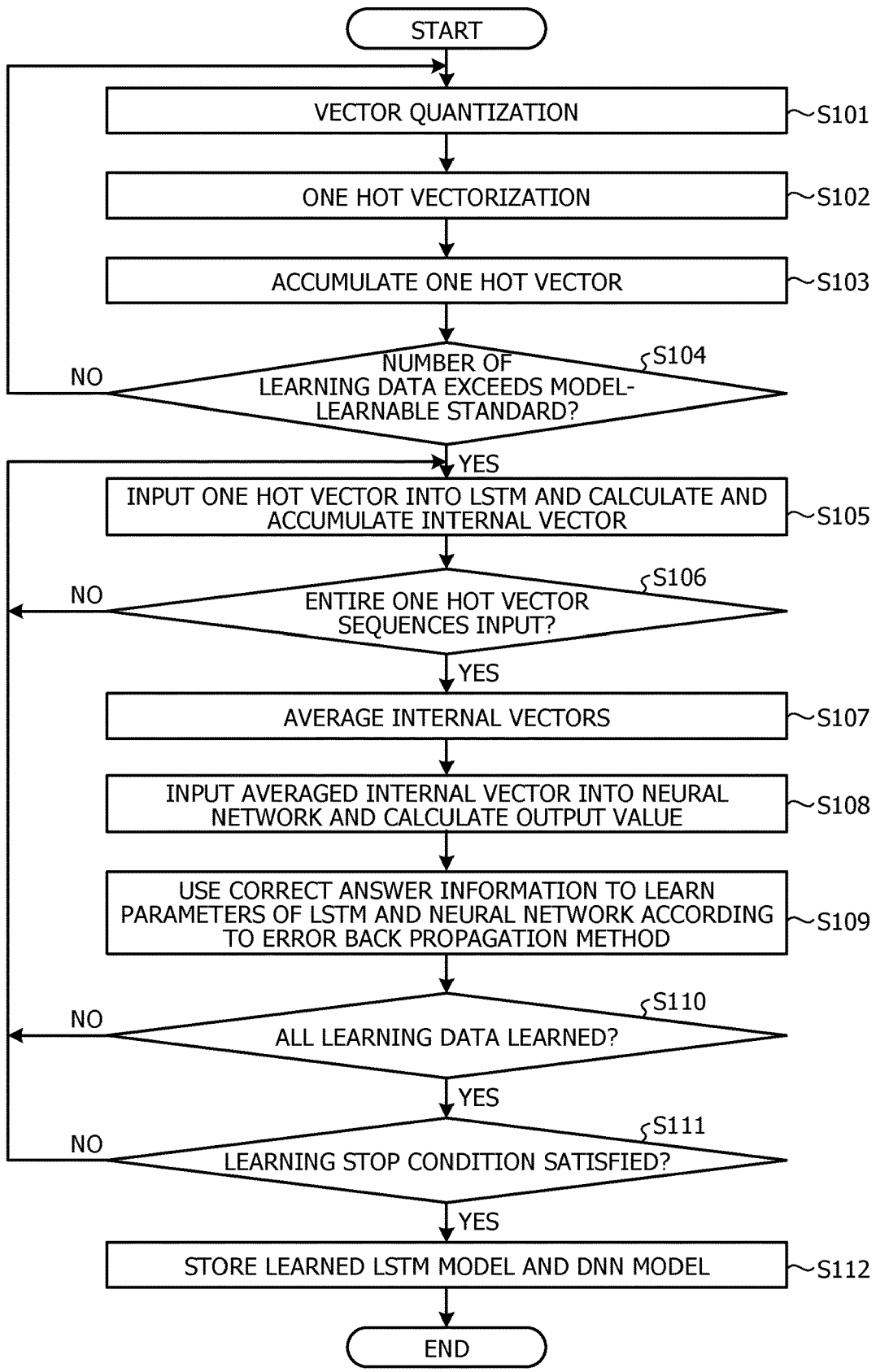
FIG. 18 is a flowchart illustrating a processing procedure of the learning device according to the first embodiment.

Next, an example of the processing procedure of the learning device 100 according to the first embodiment will be described. FIG. 18 is a flowchart illustrating the processing procedure of the learning device according to the first embodiment. As illustrated in FIG. 18, the generation unit 120 of the learning device 100 acquires learning voice data and performs a vector quantization (operation S101). The generation unit 120 converts a result of the quantization into a One Hot vector (operation S102). The generation unit 120 accumulates the One Hot vector (operation S103).

When the number of learning data (the number of One Hot vectors) does not exceed the model-learnable standard ("No" in operation S104), the generation unit 120 proceeds to operation S101. Meanwhile, when the number of learning data exceeds the model-learnable standard ("Yes" in operation S104), the generation unit 120 proceeds to operation S105.

The first calculation unit 130 of the learning device 100 inputs the One Hot vector into the LSTM 135 and calculates and accumulates an internal vector (operation S105). When the entire One Hot vector sequences have not been input ("No" in operation S106), the first calculation unit 130 proceeds to operation S105. Meanwhile, when the entire One Hot vector sequences have been input ("Yes" in operation S106), the first calculation unit 130 proceeds to operation S107. The third calculation unit 140 of the learning device 100 averages the internal vectors (operation S107).

The second calculation unit 150 of the learning device 100 inputs the averaged internal vector into the neural network 155 and calculates an output value (operation S108). The learning unit 160 of the learning device 100 uses the correct answer information 110b to learn the parameters of the LSTM 135 and the neural network 155 according to the error back propagation method (operation S109).

When the learning unit 160 has not learned all learning data ("No" in operation S110), the learning unit 160 proceeds to operation S105. When the learning unit 160 has learned all learning data ("Yes" in operation S110), the learning unit 160 proceeds to operation S111.

When the learning stop condition is not satisfied ("No" in operation S111), the learning unit 160 randomly changes the order of the learning data and then proceeds to operation S105. When the learning stop condition is satisfied ("Yes" in operation S111), the learning unit 160 proceeds to operation S112. The learning unit 160 stores the learned LSTM model 110c and DNN model 110d in the memory unit 104 (operation S112).

[Flow of Determination Process]

Figure 19:
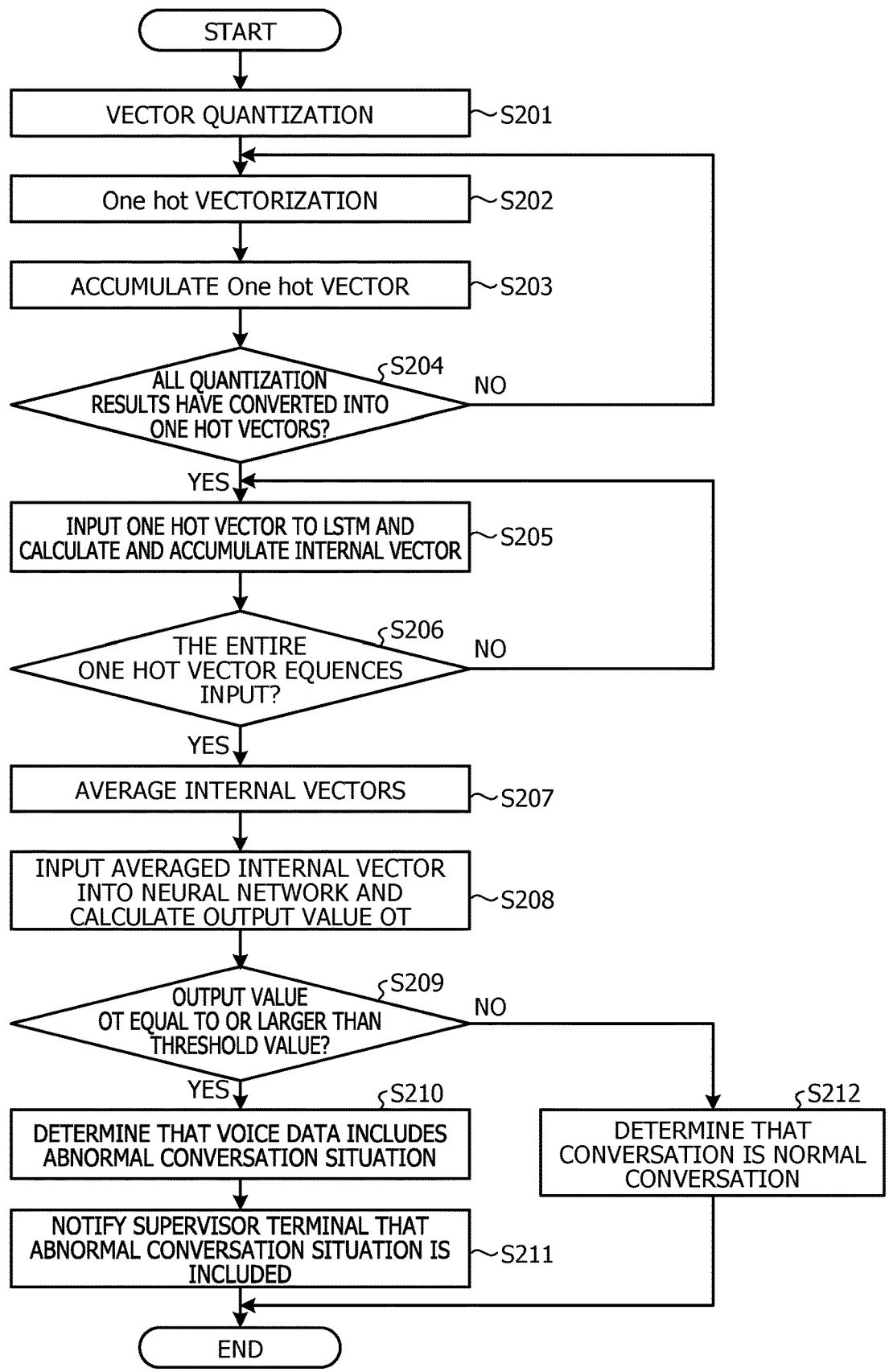
FIG. 19 is a flowchart illustrating a processing procedure of the determination device according to the first embodiment.

Next, an example of the processing procedure of the determination device 200 according to the first embodiment will be described. FIG. 19 is a flowchart illustrating the processing procedure of the determination device according to the first embodiment. As illustrated in FIG. 19, the generation unit 220 of the determination device 200 performs a vector quantization (operation S201) and converts a quantization result into a One Hot vector (operation S202). The generation unit 220 accumulates the One Hot vector (operation S203). When all the quantization results have not been converted into One Hot vectors ("No" in operation S204), the generation unit 220 proceeds to operation S202. Meanwhile, when all the quantization results have been converted into One Hot vectors ("Yes" in operation S204), the generation unit 220 proceeds to operation S205.

The first calculation unit 230 of the determination device 200 inputs the One Hot vector into the LSTM 135 and calculates and stores an internal vector (operation S205). The first calculation unit 230 calculates the internal vector using the LSTM 135 based on the learned LSTM model 110c. When the entire One Hot vector sequence has not been input ("No" in operation S206), the first calculation unit 230 proceeds to operation S205. When the entire One Hot vector sequence has been input ("Yes" in operation S206), the first calculation unit 230 proceeds to operation S207.

The third calculation unit 240 of the determination device 200 averages the internal vectors (operation S207). The second calculation unit 250 of the determination device 200 inputs the averaged internal vector into the neural network 155 and calculates an output value "Ot" (operation S208). The second calculation unit 250 calculates the output value using the neural network 155 based on the learned DNN model 110*d*. The output value "Ot" indicates the probability that a conversation is in an abnormal conversation situation.

The determination unit 260 of the determination device 200 determines whether the output value "Ot" is equal to or larger than the threshold value (operation S209). When it is determined that the output value "Ot" is equal to or larger than the threshold value ("Yes" in operation S209), the determination unit 260 determines that the voice data 204*a* includes an abnormal conversation situation (operation S210). The notification unit 205*b* of the determination device 200 notifies the supervisor terminal 40 that an abnormal conversation situation is included (operation S211).

Meanwhile, when the output value Ot is smaller than the threshold value ("No" in operation S209), the determination unit 260 determines that the conversation is a normal conversation (operation S212).

[Effects]

Next, the effects of the learning device 100 according to the first embodiment will be described. The learning device 100 machine-learns the LSTM model 110*c* and the DNN model 110*d* by using a set of a quantization sequence extracted from the learning voice data, and correct answer information. For this reason, the LSTM model 110*c* and the DNN model 110*d* may be learned without using trial and error, skillful knowledge, and know-how for setting a keyword for detecting a specific conversation situation. In addition, the determination device 200 may appropriately determine whether a specific conversation situation is included in the voice data by using the learned LSTM model 110*c* and DNN model 110*d* to perform a process on the voice data.

Figure 20:
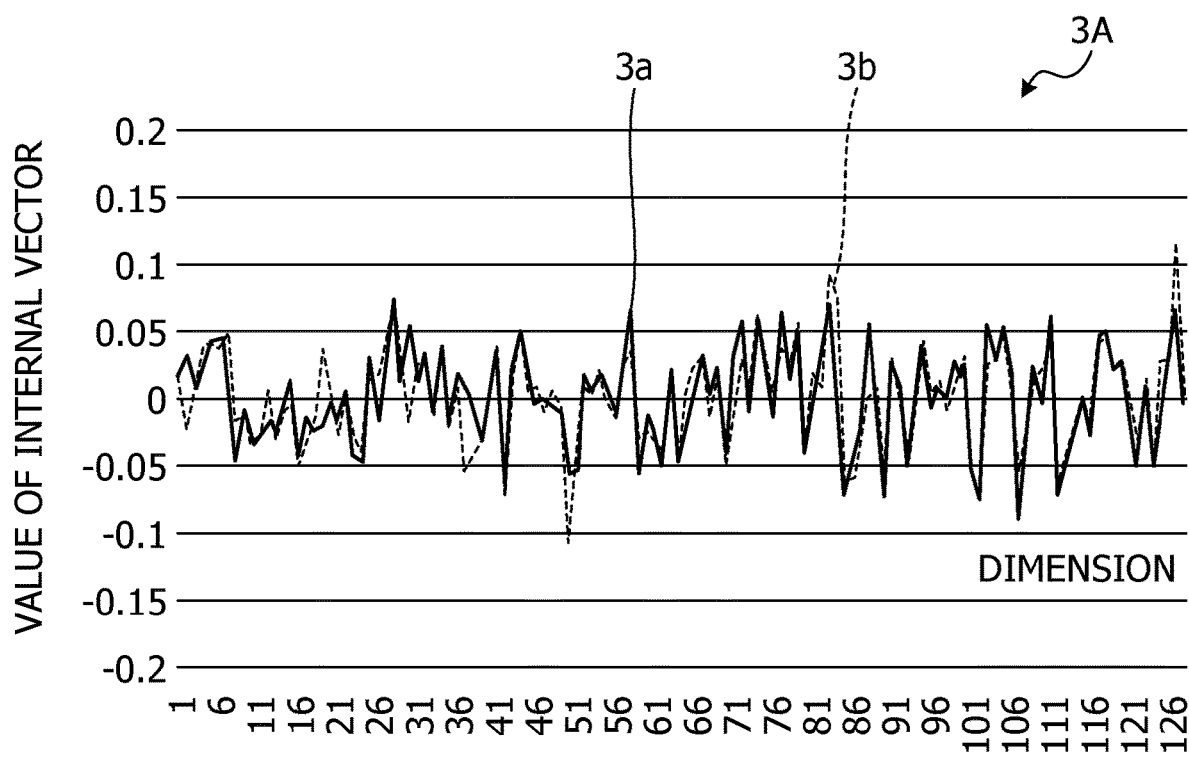
FIG. 20 is a diagram illustrating an example of an internal vector of voice data including an abnormal conversation situation.

FIG. 20 is a diagram illustrating an example of an internal vector of the voice data including an abnormal conversation situation. The vertical axis of a graph 3A in FIG. 20 represents the value of the internal vector, and the horizontal axis thereof represents the dimension of the internal vector. A line segment 3*a* indicates an internal vector of the voice data of a first call including an abnormal conversation situation. A line segment 3*b* indicates an internal vector of the voice data of a second call including an abnormal conversation situation. An abnormal conversation situation is included. As illustrated in FIG. 20, in a call of an abnormal state, the shape of the internal vector is the same even in another call.

Figure 21:
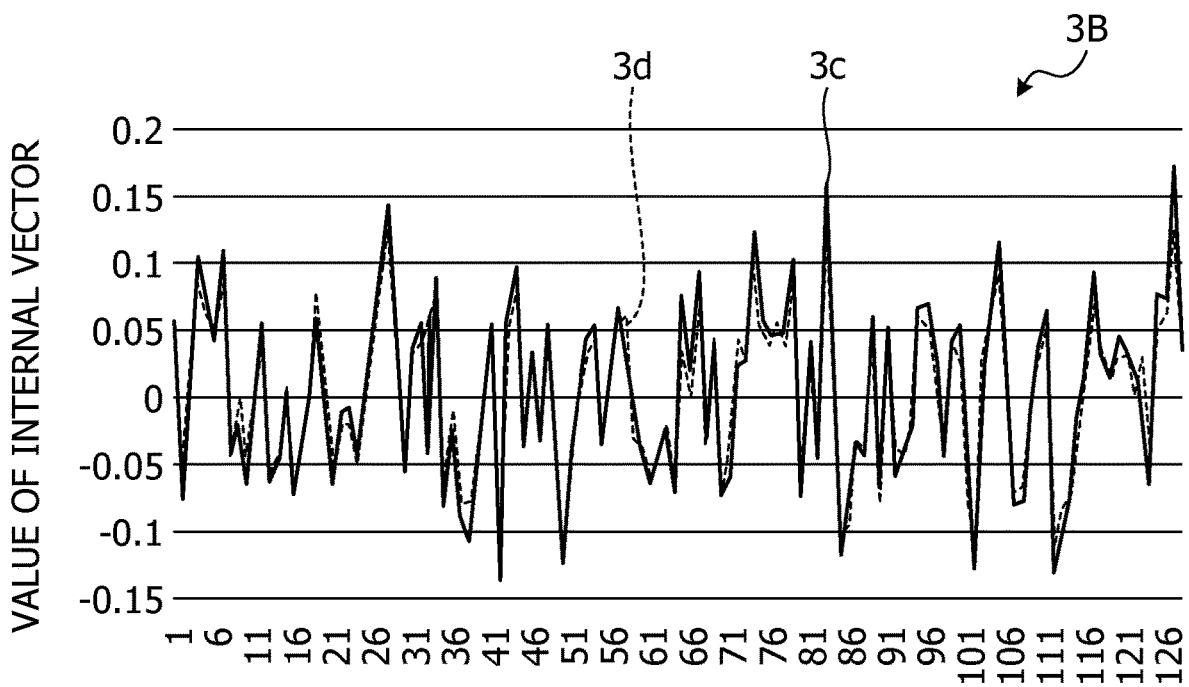
FIG. 21 is a diagram illustrating an example of an internal vector of voice data of a normal conversation.

FIG. 21 is a diagram illustrating an example of an internal vector of the voice data of a normal conversation. The vertical axis of a graph 3B in FIG. 21 represents the value of the internal vector, and the horizontal axis thereof represents the dimension of the internal vector. A line segment 3*c* indicates an internal vector of the voice data of a normal third call. A line segment 3*d* indicates an internal vector of the voice data of a normal fourth call. In a normal call, the shape of the internal vector is the same even in another call.

When the vector shape of the voice data of the abnormal conversation situation illustrated in FIG. 20 is compared with the vector shape of the voice data of the normal call illustrated in FIG. 21, the vector shapes are significantly different from each other. Therefore, by using the internal vector, it is possible to determine whether an abnormal conversation situation is included without setting a keyword, and it is possible to appropriately learn the LSTM model 110*c* and the DNN model 110*d* for the determination.

Further, the learning device 100 quantizes a physical feature (power spectrum or the like) of voice with reference to human auditory characteristics, and detects a deviation of utterance used for analysis of a conversation situation based on a result of the quantization. In addition, the learning device 100 may generate an "efficient quantization table" that does not have a large deviation in the number of selections for each quantization point excluding silence equivalent, by automatic adjustment.

For example, although an acoustic model using a phoneme model of language-dependent information or the like may be considered, the acoustic model needs to be generated for each language, which requires a huge amount of time and cost. Meanwhile, the learning device 100 may analyze the conversation situation without generating a model of costly language-dependent information, by detecting the deviation of utterance using the "efficient quantization table".

Second Embodiment

The embodiment of the present disclosure has been described above, but the present disclosure may be implemented in various different forms other than the above-described embodiment.

Extended Example

Figure 22:
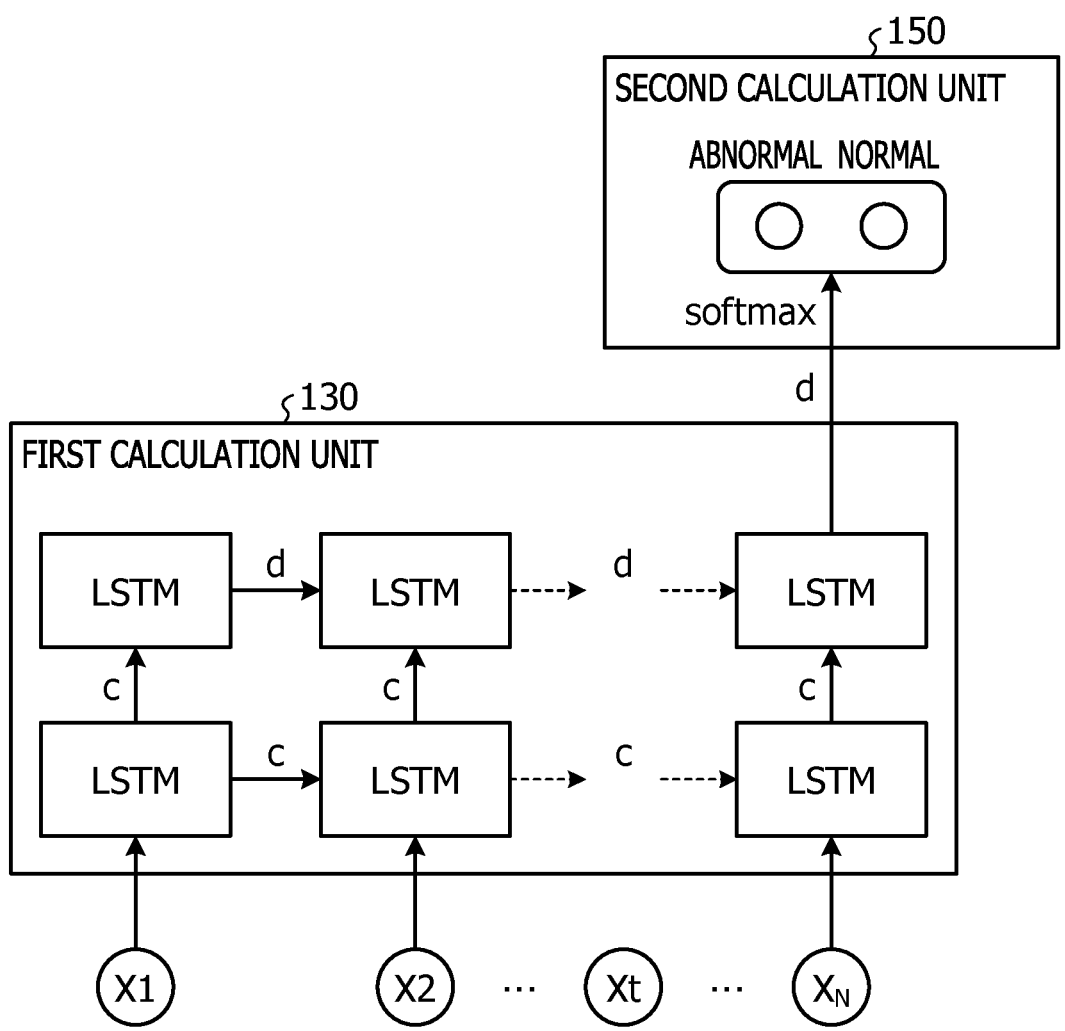
FIG. 22 is a diagram for explaining an extension example of a first calculation unit and a second calculation unit.

An extended example of the first calculation unit and the second calculation unit will be described. FIG. 22 is a diagram for explaining an extended example of the first calculation unit and the second calculation unit. Here, as an example, descriptions will be given using the first calculation unit 130 and the second calculation unit 150.

The first calculation unit 130 multi-stages the LSTM that is the first network, and sets an internal vector d of the LSTM to the upper stage to an abnormal/normal two-dimensional vector. An internal vector c corresponds to the internal vector h described with reference to FIG. 14. For example, the internal vector c is a 128-dimensional vector. The internal vector d is input into the second calculation unit 150 through the third calculation unit 140 (not illustrated).

The second calculation unit 150 executes only Softmax calculation for the internal vector d without executing the second network, and calculates the probability of an abnormal conversation situation and the probability of a normal conversation. Since the essential element of the second calculation unit 150 is a processing unit that performs the Softmax calculation and is to obtain the probability of abnormality/normality from the internal vector d, the first calculation unit 130 and the second calculation unit 150 may be extended as illustrated in FIG. 22.

Figure 23:
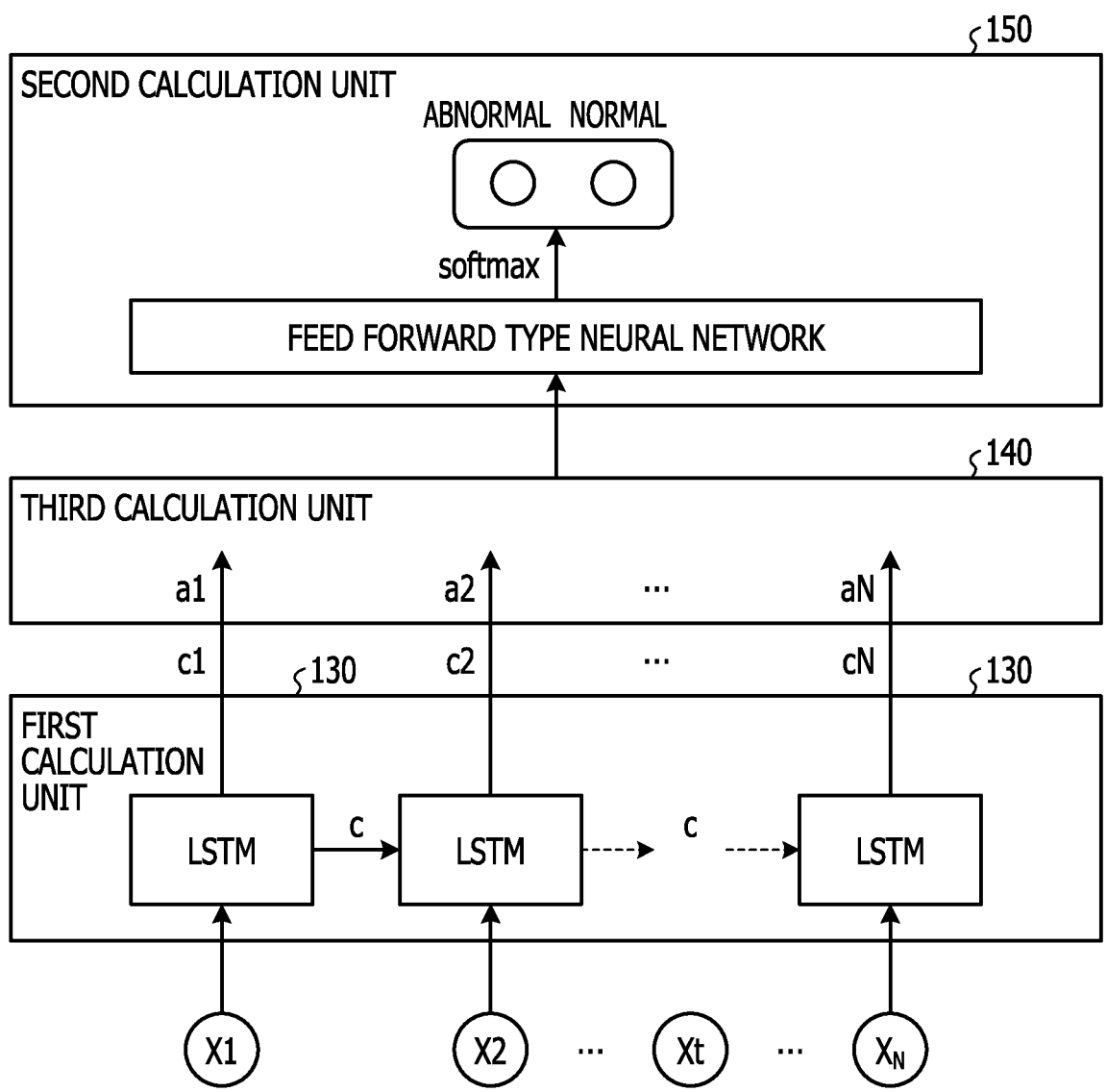
FIG. 23 is a diagram for explaining other processes of a third calculation unit.

Other processes of the third calculation unit will be described. FIG. 23 is a diagram for explaining other processes of the third calculation unit. Here, as an example, descriptions will be given using the first calculation unit 130, the second calculation unit 150, and the third calculation unit 140.

The third calculation unit 140 provides weighting parameters "a1, a2, . . . , aN" from the beginning for internal vectors c1 to cN output from the first calculation unit 130 for each input quantization result. The weighting parameters are parameters in the time direction. For example, a vector output from the third calculating unit 140 to the second calculating unit 150 is "a1·c1+a2·c2+, . . . , +aN·cN". When learning the LSTM model 110*c* and the DNN model 110*d*, the learning unit 160 also learns the weighting parameters of the third calculation unit 140. By performing such a process, the weighting in the time direction when generating an average vector may be optimized.

Application Example

Figure 24:
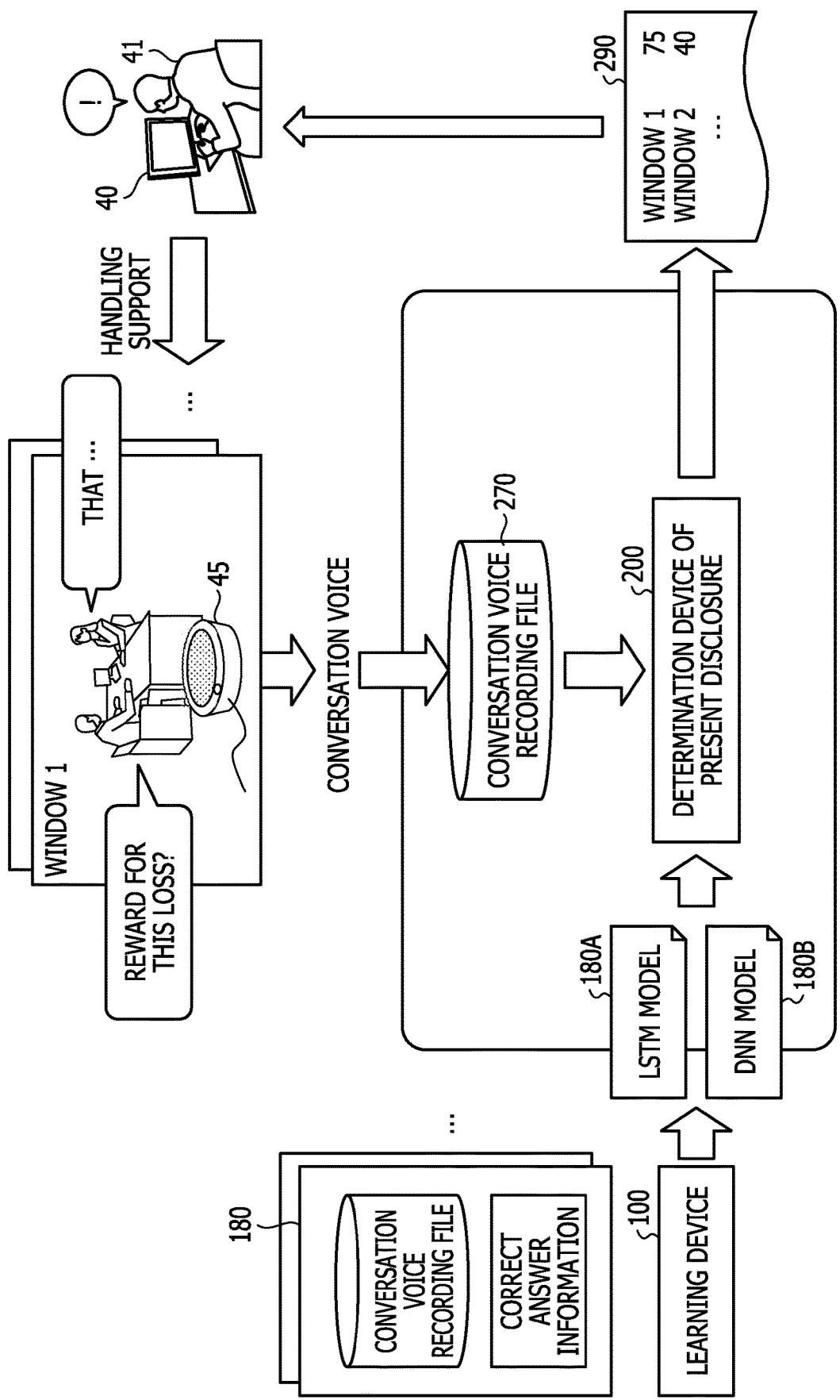
FIG. 24 is a diagram illustrating an example of other systems according to the embodiment.

FIG. 24 is a diagram illustrating an example of other systems according to the present embodiment. In FIG. 24, as an example, descriptions will be given with the learning device 100 and the determination device 200.

The learning device 100 learns an LSTM model 180A and a DNN model 180B based on learning data 180 of a conversation at the time of handling at a window. The learning data 180 includes a conversation voice recording file in which a conversation at the time of handling at the window in the past was recorded, and correct answer information indicating whether a customer service problem has occurred. The conversation in handling at the window is recorded using a microphone 45.

The determination device 200 acquires voice of the window and uses the LSTM model 180A and the DNN model 180B to calculate information 270 on the probability of the occurrence of customer service problem. The determination device 200 notifies the supervisor terminal 40 of the information 290 on the probability of the occurrence of customer service problem. A manager person in charge 41 refers to the information 290 on the probability of the occurrence of customer service problem to support the handling.

By constructing the system illustrated in FIG. 24, it becomes possible to detect customer service problem utterances at handling at the window and support the handling.

[Numerical Value, Etc.]

Numerical examples, threshold values, etc. used in the above-described embodiments are merely examples, and may be arbitrarily changed. Further, in the present embodiments, a specific conversation situation is described as an "abnormal conversation situation", but the specific conversation situation is not limited to the abnormal conversation situation. For example, the specific conversation situation may be a conversation situation in which a meeting is stagnant, a conversation situation in which a customer service problem occurs, a conversation situation preferable for a customer, or the like. Further, a quantization point is not limited to a two-dimensional vector, and a multi-dimensional vector may be used for the quantization point.

[Initialization]

In the above embodiments, an example in which the initial value of the quantization table 122 is generated using white noise has been described, but the present disclosure is not limited thereto. For example, so-called pink noise or pseudo voice prepared in advance may be used. Further, it is possible to directly generate the initial value of the quantization table using these noises instead of using features of white noise and pink noise.

[System]

Information including the processing procedures, control procedures, specific names, and various data and parameters illustrated in the above specification and drawings may be arbitrarily changed unless otherwise specified. A real-time processing unit 33 corresponds to a generation unit, a count unit 32 corresponds to a storage control unit, and a request processing unit 34 corresponds to an acquisition unit and a generation unit.

In addition, each element of each device illustrated in the drawings is functionally conceptual, and does not necessarily have to be physically configured as illustrated. That is, the specific form of distribution and integration of each device is not limited to that illustrated. That is, all or a part of the elements may be functionally or physically distributed/integrated in arbitrary units according to various loads or usage conditions. For example, the control unit 105 of the learning device 100 may have the same function as the control unit 205 of the determination device 200 to learn the LSTM model 110c and the DNN model 110d, and may determine whether the voice data includes a specific conversation situation.

Further, all or a part of each processing function performed in each device may be implemented by a CPU and a program analyzed and executed by the CPU, or may be implemented as hardware by wired logic.

[Hardware]

Figure 25:
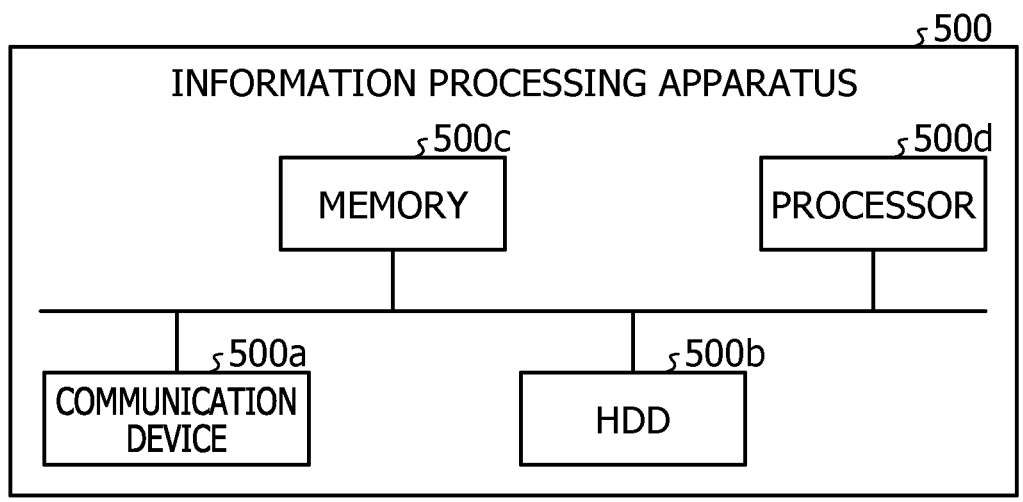
FIG. 25 is a diagram for explaining a hardware configuration example.

Next, a hardware configuration example of the learning device 100 and the determination device 200 will be described. Since the learning device 100 and the determination device 200 have the same hardware configuration, the devices will be described here as an information processing apparatus 500. FIG. 25 is a diagram for explaining a hardware configuration example. As illustrated in FIG. 25, the information processing apparatus 500 includes a communication device 500a, an HDD (Hard Disk Drive) 500b, a memory 500c, and a processor 500d. Further, the respective units illustrated in FIG. 25 are interconnected by a bus or the like.

The communication device 500a is a network interface card or the like, and communicates with other servers. The HDD 500b stores a program and DB for operating the functions illustrated in FIGS. 4 and 16.

The processor 500d operates a process that executes each function described with reference to FIGS. 4 and 16 by reading a program that executes the same process as each processing unit illustrated in FIGS. 4 and 16 from the HDD 500b or the like and deploying the program on the memory 500c. For example, taking the learning device 100 as an example, this process performs the same function as each processing unit included in the learning device 100. Specifically, the processor 500d reads a program having the same functions as the acquisition unit 105a, the notification unit 105b, the generation unit 120, the first calculation unit 130, the third calculation unit 140, the second calculation unit 150, the learning unit 160, and the like from the HDD 500b or the like. Then, the processor 500d executes a process that executes the same process as the acquisition unit 105a, the notification unit 105b, the generation unit 120, the first calculation unit 130, the third calculation unit 140, the second calculation unit 150, the learning unit 160, and the like.

In this way, the information processing apparatus 500 operates as an information processing apparatus that executes a learning method by reading and executing a program. Further, the information processing apparatus 500 may also implement the same functions as those of the above-described embodiments by reading the program from a recording medium by a medium reading device and executing the read program. A program referred to in other embodiments is not limited to being executed by the information processing apparatus 500. For example, the present disclosure may be similarly applied to a case where another computer or server executes the program, or a case where these cooperate with each other to execute the program.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein an update program that causes a computer to execute a procedure including voice processing after training of a neural network not identifying words in utterance data, the procedure comprising:
calculating a selection rate of each of a plurality of quantization points included in a quantization table according to white noise included in the quantization table as an initial value, based on quantization data obtained by quantizing features of a plurality of utterance data;
updating the quantization table by updating the plurality of quantization points based on the selection rate;
setting parameters of at least one neural network based on the quantization table;
receiving voice data; and
detecting a result of a specific conversation situation by the at least one neural network based on the voice data after said setting of the parameters.

2. The non-transitory computer-readable recording medium according to claim 1, wherein the updating of the quantization table includes
excluding, from the quantization table, quantization points whose selection rate is equal to or less than a predetermined reference, among the plurality of quantization points,
adding, to the quantization table, quantization points different from the excluded quantization points, and
updating quantization points other than the quantization points whose selection rate is equal to or less than the predetermined reference, based on a result of a selection of the quantization points.

3. The non-transitory computer-readable recording medium according to claim 2, wherein the calculating of the selection rate includes:
calculating a distance between each of the quantization data based on the feature of each of the plurality of utterance data and each of the plurality of quantization points included in the quantization table, and
selecting a quantization point of the plurality of quantization points that minimizes the distance, as the result of the selection of each of the quantization point.

4. The non-transitory computer-readable recording medium according to claim 3, wherein the updating of the quantization table includes:
excluding, from the quantization table, the quantization points whose the selection rate is equal to or less than the predetermined reference,
adding, to the quantization table, quantization points before update, whose selection rate is equal to or more than the predetermined reference, and
updating each of the quantization points whose selection rate is equal to or less than the predetermined reference to an average value of selected quantization data.

5. The non-transitory computer-readable recording medium according to claim 4,
the procedure further comprising:
calculating the selection rate of each of the plurality of quantization points based on each of the quantization data generated from a first utterance data of the plurality of utterance data; and
specifying the quantization point that includes a highest selection rate among the plurality of quantization points, as a quantization point equivalent to silence,
wherein the updating of the quantization table includes:
updating the quantization point equivalent to silence to an average value of the selected quantization data, and
updating quantization points other than the quantization point equivalent to silence, based on the selection rate.

6. The non-transitory computer-readable recording medium according to claim 5, wherein the updating of the quantization table includes:
calculating a quantization error based on quantization points after update excluding the quantization point equivalent to silence,
when the quantization error is equal to or larger than a threshold value,
updating the quantization point equivalent to silence by using a second utterance data of the plurality of utterance data, and
updating quantization points other than the quantization point equivalent to silence, based on the selection rate, and
when the quantization error is smaller than the threshold value, outputting the quantization table after update.

7. The non-transitory computer-readable recording medium according to claim 1, the procedure further comprising:
generating a quantization result associated with a quantization point corresponding to a feature of the voice information, based on vector quantization on input voice information and the quantization table after update that includes the updated plurality of quantization points; and
performing learning of a model to which a neural network is applied, when the quantization result is input into the model so that output information output from the model approaches correct answer information for indicating whether the voice information corresponding to the quantization result includes a predetermined conversation situation.

8. The non-transitory computer-readable recording medium according to claim 7, the procedure further comprising: determining whether the predetermined conversation situation is included in utterance data to be determined, based on the output information acquired by inputting quantization data obtained by quantizing the feature of the utterance data to be determined, into the model that has been subjected to the learning.

9. The non-transitory computer-readable recording medium according to claim 1, wherein the selection rate is a ratio of a total of selected features to a number of selection of the quantization point.

10. The non-transitory computer-readable recording medium according to claim 1, wherein the features are information extracted from utterance data and to be used for speech recognition.

11. A method comprising:
calculating a selection rate of each of a plurality of quantization points included in a quantization table according to white noise included in the quantization table as an initial value, based on quantization data obtained by quantizing features of a plurality of utterance data and without identifying target data among the utterance data;
updating the quantization table by updating the plurality of quantization points based on the selection rate, by a processor;

setting parameters of at least one neural network based on the quantization table;
receiving voice data; and
detecting a result of a specific conversation situation by the at least one neural network based on the voice data after said setting of the parameters.

12. An information processing apparatus comprising:
a memory; and
a processor coupled to the memory and configured to:
  calculate a selection rate of each of a plurality of quantization points included in a quantization table according to white noise included in the quantization table as an initial value, based on quantization data obtained by quantizing features of a plurality of utterance data and independent of a target in the utterance data;
  update the quantization table by updating the plurality of quantization points based on the selection rate;
  setting parameters of at least one neural network based on the quantization table;
  receiving voice data; and
  detecting a result of a specific conversation situation by the at least one neural network based on the voice data after said setting of the parameters.

* * * * *